(12) United States Patent
Natarajan et al.

(10) Patent No.: US 9,852,239 B2
(45) Date of Patent: Dec. 26, 2017

(54) METHOD AND APPARATUS FOR PREDICTION OF COMMUNITY REACTION TO A POST

(71) Applicant: Adobe Systems Inc., San Jose, CA (US)

(72) Inventors: Anandhavelu Natarajan, Kangayam (IN); Balaji Vasan Srinivasan, Chennai (IN); Vineet Gupta, Kanpur (IN); Anand Ganesan, Chennai (IN); Anuj Jain, New Delhi (IN); Shriram Revankar, Bangalore (IN); Japnik Singh, Amritsar (IN); Bharat Polineni, Hyderabad (IN)

(73) Assignee: ADOBE SYSTEMS INCORPORATED, San Jose, CA (US)

( * ) Notice: Subject to any disclaimer, the term of this patent is extended or adjusted under 35 U.S.C. 154(b) by 1255 days.

(21) Appl. No.: 13/625,193

(22) Filed: Sep. 24, 2012

(65) Prior Publication Data
US 2014/0088944 A1  Mar. 27, 2014

(51) Int. Cl.
G06F 17/10 (2006.01)
G06F 17/50 (2006.01)
G06Q 30/02 (2012.01)
G06Q 50/00 (2012.01)

(52) U.S. Cl.
CPC ......... G06F 17/5009 (2013.01); G06Q 30/02 (2013.01); G06Q 50/01 (2013.01)

(58) Field of Classification Search
None
See application file for complete search history.

(56) References Cited

U.S. PATENT DOCUMENTS

| 5,999,918 A * | 12/1999 | Williams | G06Q 40/00 702/179 |
| 8,396,777 B1 * | 3/2013 | Fine | G06Q 10/04 705/35 |
| 8,583,470 B1 * | 11/2013 | Fine | G06Q 40/04 705/7.31 |
| 2004/0024601 A1 * | 2/2004 | Gopinath | G10L 15/22 704/270 |
| 2004/0034520 A1 * | 2/2004 | Langkilde-Geary | G06F 17/2881 704/1 |

(Continued)

OTHER PUBLICATIONS

"Predicting Popular Messages in Twitter", Hong et al. Mar. 28-Apr. 1, 2011, Hyderabad, India. 2 pages.*

(Continued)

*Primary Examiner* — Omar Fernandez Rivas
*Assistant Examiner* — Cuong Luu
(74) *Attorney, Agent, or Firm* — Keller Jolley Preece

(57) ABSTRACT

A method and apparatus for prediction of community reaction to a post for an online social community is disclosed. The method comprises receiving a proposed post as input to a generated prediction model prior to the proposed post being posted to an online social community; predicting a community reaction to the proposed post using the prediction model; and displaying the predication, wherein the prediction comprises a sentiment score and at least one of a number of responses, a number of responders to the post, a longevity of the post, or a half-life of the post.

20 Claims, 13 Drawing Sheets

(56) References Cited

U.S. PATENT DOCUMENTS

| | | | | |
|---|---|---|---|---|
| 2005/0010409 | A1* | 1/2005 | Hull | G06K 15/00 704/243 |
| 2006/0136426 | A1* | 6/2006 | Roth | G06F 17/3089 |
| 2007/0237428 | A1* | 10/2007 | Goodwin | G06K 9/00442 382/309 |
| 2008/0027800 | A1* | 1/2008 | Schabes | G06F 17/3064 705/14.54 |
| 2008/0134282 | A1* | 6/2008 | Fridman | G06Q 10/10 726/1 |
| 2008/0214148 | A1* | 9/2008 | Ramer | G06F 17/30749 455/414.1 |
| 2009/0055175 | A1* | 2/2009 | Terrell, II | G10L 15/01 704/235 |
| 2009/0125529 | A1* | 5/2009 | Vydiswaran | G06F 17/30864 |
| 2009/0164897 | A1* | 6/2009 | Amer-Yahia | G06F 3/00 715/703 |
| 2010/0169311 | A1* | 7/2010 | Tengli | G06F 17/30864 707/736 |
| 2011/0201911 | A1* | 8/2011 | Johnson | A61B 5/14532 600/365 |
| 2012/0042020 | A1* | 2/2012 | Kolari | G06Q 10/107 709/206 |
| 2012/0246054 | A1* | 9/2012 | Sastri | G06Q 50/01 705/37 |
| 2012/0316916 | A1* | 12/2012 | Andrews | G06Q 40/08 705/7.28 |
| 2012/0317085 | A1* | 12/2012 | Green | G06F 17/30867 707/704 |
| 2012/0324353 | A1* | 12/2012 | Torbey | G06F 3/048 715/716 |
| 2013/0103667 | A1* | 4/2013 | Minh | G06F 17/30864 707/709 |
| 2013/0138577 | A1* | 5/2013 | Sisk | G06Q 30/02 705/36 R |
| 2013/0218663 | A1* | 8/2013 | el Kaliouby | G06Q 30/0242 705/14.41 |
| 2013/0344968 | A1* | 12/2013 | Halfteck | A63F 13/00 463/43 |
| 2013/0346496 | A1* | 12/2013 | Maarek | G06Q 50/01 709/204 |
| 2014/0052684 | A1* | 2/2014 | Liao | G06F 17/2785 706/46 |
| 2016/0223554 | A1* | 8/2016 | Cesano | G01N 33/57426 |
| 2017/0143202 | A1* | 5/2017 | Palanker | A61B 3/0025 |

OTHER PUBLICATIONS

"Delta TFIDF: An Improved Feature Space for Sentiment Analysis", Martineau et al. Proceedings of the Third International ICWSM Conference (2009). 4 pages.*

"How Useful are Your Comments? Analyzing and Predicting YouTube Comments and Comment Ratings", Siersdorfer et al. Apr. 26-30, 2010, Raleigh, North Carolina, USA. 10 pages.*

"Predicting Movie Sales from Blogger Sentiment", Mishne et al. © 2006. 4 pages.*

Adobe Social Analytics Dashboard. Apr. 2011. 1 page.*

Adobe Social Analytics Press Release. May 19, 2011. 3 pages.*

Artzi, Yoav, Patrick Pantel, and Michael Gamon. "Predicting responses to microblog posts." Proceedings of the 2012 Conference of the North American Chapter of the Association for Computational Linguistics: Human Language Technologies. Association for Computational Linguistics, Jun. 3-8, 2012.*

Berger et al. A Maximum Entropy Approach to Natural Language Processing Association for Computational Linguistics 1996, pp. 39-71.*

Jamali et al. Digging Digg: Comment Mining, Popularity Prediction, and Social Network Analysis Technical Report GMU-CS-TR-2009, pp. 1-8.*

Artzi et a. Predicting Responses to Microblog Posts Jun. 2012, pp. 602-606.*

Miller WordNet: A Lexical Database for English Communications of the ACM, Nov. 1995, pp. 39-41.*

Kyle Koh et al., "ManiWordle: Providing Flexible Control over Wordle", 2010, 8 pgs.

Bongshin Lee et al., "SparkClouds: Visualizing Trends in Tag Clouds", 2010, 8 pgs.

Gerlof Bouma, "Normalized (Pointwise) Mutual Information in Collocation Extraction", 2009, 11 pgs.

Kamal Nigam et al., "Using Maximum Entropy for Text Classification", 1999, 7 pgs.

Ramnath Balasubramanyan et al., "What pushes their buttons? Predicting comment polarity from the content of political blog posts", 2011, 7 pgs.

George A. Miller, "WordNet: A Lexical Database for English", 1995, pp. 39-41.

* cited by examiner

METHOD AND APPARATUS FOR PREDICTION OF COMMUNITY REACTION TO A POST

BACKGROUND OF THE INVENTION

Field of the Invention

Embodiments of the present invention generally relate to online social communities and, more particularly, to a method and apparatus for predicting community reaction to a post to an online social community.

Description of the Related Art

With the evolution of social media, enterprise marketers are increasing the reach of social networks to leverage business needs. Products such as ADOBE CQ® Social Communities are used for providing a community forum engaging and interacting with customers. These forums may be used for conveying product understanding to the customer, gathering feedback on products, and understanding the customer needs among others. Other communities may be for larger social interactions, such as FACEBOOK®, or TWITTER®, or other online communities sharing common interests, such as a specific technology, or a political event.

The environment of such social communities tends to be volatile. Products such as ADOBE® SocialAnalytics, measure the impact of social media on a business. These products enable marketers to understand how conversations on social networks and online communities influence marketing performance. Generally, positive and negative sentiments expressed by members in such communities tend to have a cascade effect owing to the potential speed of dispersal and wide reach of material published on such online social communities. A post is any message published on an online forum or newsgroup and may include social posts on social platforms such as FACEBOOK®, TWITTER®, and the like, blogs, or marketing materials posted by enterprise marketers. A single post that evokes negative reaction from the community members may lead to significant damage to reputations and brand images within very short periods of time. A marketer can typically do little to curtail the negative publicity.

A community's reaction may be any reaction to an online conversation including responding, pressing a "like" button, sharing the post, emailing a post, quantifying a number of responses, likes, shares, emails or duration of responses, likes, shares, and the like. Preventive measures are generally set up to avoid evoking negative reactions on such social communities. To prevent negative community reaction, understanding the pulse of the community becomes vital. Currently, marketers laboriously scan the posts and reactions of the social community to the posts to understand the pulse of the community. However, the sheer number of posts and reactions make a thorough scan unfeasible, leaving the marketer to resort to guess work while making critical decisions regarding publishing a post.

Therefore, there is a need for a method and apparatus for predicting community reaction to a post to an online social community.

SUMMARY OF THE INVENTION

A method and apparatus for prediction of community reaction to a post for an online social community substantially as shown in and/or described in connection with at least one of the figures, as set forth more completely in the claims.

These and other features and advantages of the present disclosure may be appreciated from a review of the following detailed description of the present disclosure, along with the accompanying figures in which like reference numerals refer to like parts throughout.

Figure 1:
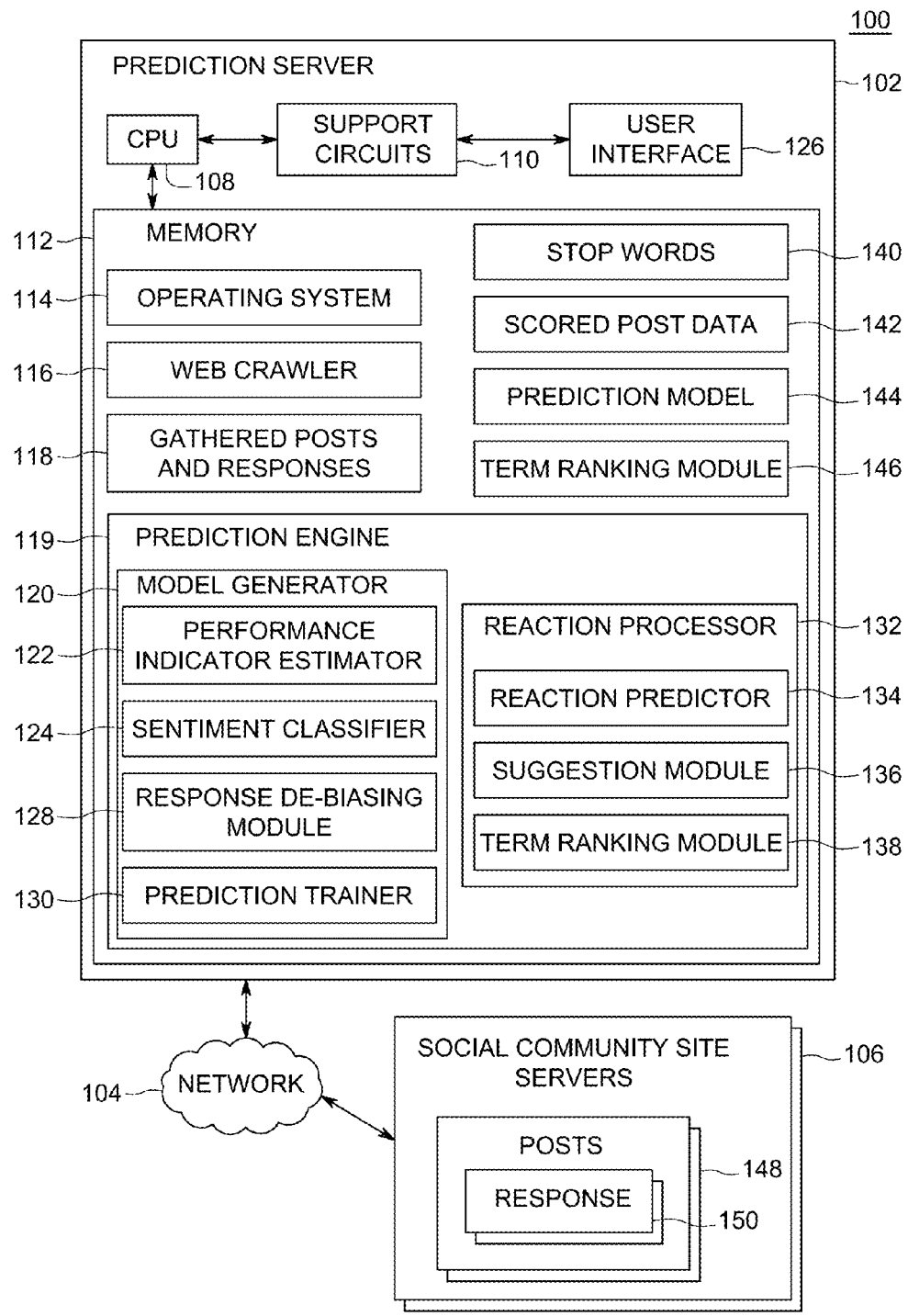
FIG. 1 depicts a block diagram of a system for predicting community reaction to a post, according to one or more embodiments of the invention.

While the method and apparatus are described herein by way of example for several embodiments and illustrative drawings, those skilled in the art will recognize that the method and apparatus for predicting community reaction to a post to an online social community are not limited to the embodiments or drawings described. It should be understood, that the drawings and detailed description thereto are not intended to limit embodiments to the particular form disclosed. Rather, the intention is to cover all modifications, equivalents and alternatives falling within the spirit and scope of the method and apparatus for prediction of community reaction to a post to an online social community as defined by the appended claims. Any headings used herein are for organizational purposes only and are not meant to limit the scope of the description or the claims. As used herein, the word "may" is used in a permissive sense (i.e., meaning having the potential to), rather than the mandatory sense (i.e., meaning must). Similarly, the words "include", "including", and "includes" mean including, but not limited to. The term "online social community" means one or more groups of individuals who share a common interest and are connected by online interactions, such as posts to an Internet-based forum, newsgroup, enterprise marketer, blog, etc. Additionally, in some embodiments, the word "post" may include not only an initial message posted to a social community, but also a response message to an initial message or a response message.

DETAILED DESCRIPTION OF EMBODIMENTS

Embodiments of the present invention comprise a method and apparatus for predicting community reaction to a post to an online social community. The predictability of reactions on an online social community is quite stable with respect to time. That is, the way a community reacts to a particular way of expressing a particular idea does not change frequently. Thus, reactions to future posts can be predicted with reasonable confidence by learning from previous reactions to posts to an online social community. A prediction model is built for an online Internet community. A separate prediction model is built for each community of interest. For example, a prediction model may be built to predict how FACEBOOK® users may react to a post on FACEBOOK®, while another prediction model is built to predict how TWITTER® users will react to a post on TWITTER®. The posts and responses are gathered from the community site and metrics are calculated for the responses. The calculated metrics may include a number of responses, a number of responses per day, a longevity of a post, a sentiment evoked by the post, and the like. The post and metrics are input into a training module that uses the posts to build the prediction model. Once the model is built, a user may enter a proposed post and receive a prediction of how the proposed post will be received by the community. In some embodiments, suggestions are provided to the user for ways to make the reaction to the proposed post more positive. The model is periodically retrained with new posts and responses retrieved from Internet.

Posts and responses are gathered from the Internet. A post is any message published on an online forum or newsgroup and may include social posts on social platforms such as FACEBOOK®, TWITTER®, and the like, blogs, or marketing materials posted by enterprise marketers. Responses may be a text response, a "Like" indication, an email, or any published reply to a post. Gathering the posts and responses may involve sending Hyper-text Transfer Protocol (HTTP) requests to retrieve the posts from the Internet. Other data protocols, formats, and sources may also be used to gather posts from the Internet, an intranet, a wired or wireless LAN, WAN, etc.

In some embodiments, the responses to the posts are input to a performance indicator estimator for calculating performance indicator scores as metrics. Performance indicators of a post may be a number of responses to a post, a number of readers who read and responded to the post, a rate of growth or decline of readers determined by a half-life for the post, a longevity of the post, a sentiment evoked by the post and the like. A sentiment indicates subjective information about the response, such as attitude, opinion, emotion, and intent. The calculated performance indicator scores are "de-biased". De-biasing adapts scores to how negative or positive a community is in general. For example, if a community is generally very negative regardless of the topic of a post, a neutral reaction or even a slightly negative reaction to a post is considered to be positive.

In some embodiments, the performance indicator scores are binned. Data binning aggregates the scores into predefined intervals. For example, the number of responses may be binned into intervals of 0 to 10, 10 to 100, 100 to 1000, and 1000 and more. In some embodiments, the method extracts bigrams (that is, a sequence of 2 contiguous phonemes, syllables, letters or words) from the post. The bigrams are ranked according to the frequency of the occurrence of the bigram in the entirety of posts retrieved from the community. A predefined number of the top bigrams is stored with the post and the calculated scores.

The posts and associated scores are input into a prediction trainer to build a prediction model. Once the prediction model is built, a proposed post from a user is input into the model. A predicted reaction is returned for all performance indicators used to build the model. In some embodiments, the method provides suggestions for improving the overall response to the proposed post. If a suggestion is selected, the method inputs a revised proposed post into the prediction model and returns a predicted reaction to the revised proposed post.

In some embodiments, the prediction is displayed showing intervals for performance indicators into which the predicted reactions will fall along with a varying shade indicating the confidence of a corresponding interval. In some embodiments, the text of the post is displayed with a predicted reaction to each term in the text, showing different colors for positive sentiment, negative sentiment, and neutral terms as well as various font sizes indicating the extremity of the predicted reaction. In other embodiments, an interactive word cloud is displayed providing a 3-dimensional image of words in various colors indicating the positive, negative, or neutral sentiment, and font sizes indicating the probability of the correctness of the predicted reaction. In still other embodiments, a list of synonyms for words in the post that have a negative predicted reaction is displayed. A synonym may be selected and substituted for the term having the negative predicted reaction. The method displays the post with the substituted term and a new predicted reaction.

In some embodiments, the predication trainer is retrained automatically. In other embodiments, the prediction trainer retrains the system at predefined intervals, for example, every two days. The predefined time is determined by the stability of the community reactions. For example, if a community's reactions change every two weeks, the prediction trainer may be retrained at a frequency of every fifteen days. In still other embodiments, the prediction trainer gathers published posts from the community continuously.

In some embodiments, published posts are monitored and displayed. Older posts are displayed with an actual sentiment determined from the responses and a predicted sentiment is displayed for the reaction to newer posts. The predicted sentiment for the newer posts are updated in real time when the actual sentiment of the responses to the post are published and evaluated. In some embodiments, a user may click on a term or indicator on a display and receive additional information regarding the post(s) associated with the term or indicator.

Advantageously, the method may be provided as a service or integrated with marketing software, such as ADOBE® Digital Marketing Suite. Alternatively, the service may be integrated in existing social community sites using application programming interfaces (APIs) so users may see what response their post may receive before the post goes live.

Various embodiments of an apparatus and method for prediction of community reaction to a post for a social community are described. In the following detailed description, numerous specific details are set forth to provide a thorough understanding of the claimed subject matter. However, it will be understood by those skilled in the art that claimed subject matter may be practiced without these specific details. In other instances, methods, apparatuses or systems that would be known by one of ordinary skill have not been described in detail so as not to obscure claimed subject matter.

Some portions of the detailed description which follow are presented in terms of algorithms or symbolic representations of operations on binary digital signals stored within a memory of a specific apparatus or special purpose computing device or platform. In the context of this particular specification, the term specific apparatus or the like includes a general purpose computer once it is programmed to perform particular functions pursuant to instructions from program software. Algorithmic descriptions or symbolic representations are examples of techniques used by those of ordinary skill in the signal processing or related arts to convey the substance of their work to others skilled in the art. An algorithm is here, and is generally, considered to be a self-consistent sequence of operations or similar signal processing leading to a desired result. In this context, operations or processing involve physical manipulation of physical quantities. Typically, although not necessarily, such quantities may take the form of electrical or magnetic signals capable of being stored, transferred, combined, compared or otherwise manipulated. It has proven convenient at times, principally for reasons of common usage, to refer to such signals as bits, data, values, scores, elements, symbols, characters, terms, numbers, numerals or the like. It should be understood, however, that all of these or similar terms are to be associated with appropriate physical quantities and are merely convenient labels. Unless specifically stated otherwise, as apparent from the following discussion, it is appreciated that throughout this specification discussions utilizing terms such as "processing," "computing," "calculating," "determining" or the like refer to actions or processes of a specific apparatus, such as a special purpose computer or a similar special purpose electronic computing device. In the context of this specification, therefore, a special purpose computer or a similar special purpose electronic computing device is capable of manipulating or transforming signals, typically represented as physical electronic or magnetic quantities within memories, registers, or other information storage devices, transmission devices, or display devices of the special purpose computer or similar special purpose electronic computing device.

FIG. 1 depicts a block diagram of a system 100 for predicting community reaction to a post, according to one or more embodiments of the invention. The system 100 comprises a prediction server 102 and one or more social community site servers 106 connected via a network 104.

The social community site server 106 provides an interface (not shown) for multiple users to interact over the network 104. User interactions are recorded (stored) on the social community site servers 106. According to an embodiment, the activity on the social community site server 106 comprises posts 148 published on the social community and community responses 150 to such posts 148. The community responses 150 may be any form of reaction comments, such as email messages, reviews or views published for the benefit of other members of the community or one term/phrase or sentiment indicator, such as like and dislike indicators.

The prediction server 102 comprises a CPU 108, support circuits 110, a user interface 126, and a memory 112. The prediction server 102 is a type of computing device (e.g., a laptop, a desktop, a tablet, a mobile device and/or the like). The CPU 108 may comprise one or more commercially available microprocessors or microcontrollers that facilitate data processing and storage. The various support circuits 110 facilitate the operation of the CPU 108 and include one or more clock circuits, power supplies, cache, input/output circuits, displays, and the like. The memory 112 comprises at least one of Read Only Memory (ROM), Random Access Memory (RAM), disk drive storage, optical storage, removable storage and/or the like. The memory 112 comprises an operating system 114 a web crawler 116, gathered posts and responses 118, a prediction engine 119, a file of stop words 140, scored post data 142, a prediction model 144, and a lexical database 146. The prediction engine 119 comprises a model generator 120 and a predication processor 132. The model generator 120 comprises a performance indicator estimator 122, a sentiment classifier 124, a response de-biasing module 128, and a prediction trainer 130. The prediction processor 132 comprises a reaction predictor 134, a suggestion module 136, and a term ranking module 138. In some embodiments, the sentiment classifier 124 may be included as a portion of the performance indicator estimator 122.

According to some embodiments of the invention, the operating system 114 generally manages various computer resources (e.g., network resources, file processors, and/or the like). The operating system 114 is configured to execute operations on one or more hardware and/or software modules, such as Network Interface Cards (NICs), hard disks, virtualization layers, firewalls and/or the like. Examples of the operating system 114 may include, but are not limited to, Linux, Mac OSX, BSD, Unix, Microsoft Windows, and the like.

The web crawler 116 gathers posts and responses from social community site servers 106 using one or more of various methods of data gathering known to those skilled in the art. In some embodiments, the web crawler 116 uses a list of universal resource locators (URLs). Gathering may involve sending Hyper-text Transfer Protocol (HTTP) requests to retrieve the posts and responses from the Internet. Other data protocols, formats, and sources may also be used to gather posts and responses. The gathered posts and responses 118 are stored in the memory 112. A file of stop words 140 contains words that are filtered out of text before the text is used by the system 100. Stop words 140 are words that are unlikely to affect the sentiment of a post or reaction. Stop words 140 are language independent. The English language stop words 140 may include words such as a, an, the, is, at, which, on, and the like.

The model generator 120 filters the responses to a post by removing words in the responses that are contained in the file of stop words 140. The model generator 120 also removes any punctuation from the responses. In some embodiments, model generator 120 inputs each response into the performance indicator estimator 122. The performance indicator estimator 122 calculates scores (metrics) indicative of the total number of responses, the number of responses published each day, the half-life for the responses, the longevity of the post, and the like. The model generator 120 also inputs the comments into the sentiment classifier 124. The sentiment classifier 124 is any commercially available sentiment classifier known to those of ordinary skill in the art that evaluates the sentiment of a text based on individual terms (or unigrams) in the text and returns a sentiment score within a pre-determined range. For example a range may be from −1 to +1, where −1 is an extremely negative sentiment, +1 is an extremely positive sentiment, and 0 is a neutral sentiment. In some embodiments, sentiment classifier 124 may be included as a portion of performance indicator estimator 122.

A response de-biasing module 128 normalizes the score data calculated by performance indicator 122 and sentiment classifier 124 in order to remove the effects of a general bias of a community towards negativity or positivity. For each calculated performance indicator and sentiment, the response de-biasing module 128 takes the mean and standard deviation of the scores for each response to the post and calculates a new score based on the mean and standard deviation. For example, if a post has twelve responses with sentiment scores estimated within the range of −0.75 to +0.25, the response de-biasing module 128 calculates the mean and standard deviation of the twelve scores, and calculates normalized scores by making the set of twelve scores have a zero mean and a unit variance. The model generator 120 stores the posts and the average normalized score in the scored post data 142.

In some embodiments, the model generator 120 calculates a skewness of a distribution of the normalized scores and determines a number of bins to create for the responses. The model generator 120 then filters the post using the stop words 140 in the same manner in which the responses were filtered previously. The model generator 120 extracts bigrams, or consecutive two-word pairs, from the post. The pairs are ranked according to the probability of the frequency of the pairs in a post. The top N word-pairs are stored with the post in the scored post data 142.

The predication trainer 130 uses the filtered post and the scored post data 142 to build a prediction model 144. In some embodiments, the prediction model 144 is a maximum entropy (MaxEnt) model. In other embodiments, the prediction model 144 is an enhanced support vector machine, a supervised latent Dirichlet allocation, or other classification engine well known to those of ordinary skill in the art. When the predication model 144 is a MaxEnt model, the prediction model 144 takes each term and bigram in the post and determines a conditional probability for each performance indicator and sentiment for the given term. For example, if the term is "Adobe" and the sentiment is negative, the model determines the probability that the post will be negative given that it contains the term "Adobe". The conditional probabilities related to those terms that maximize the conditional entropy are added to the model.

For example, suppose posts generating a positive reaction contain the terms, A, B, C, D, and E. MaxEnt assigns a probability of each of these terms given a positive response, P(A), P(B), P(C), P(D), and P(E), respectively, given a constraint P(A)+P(B)+P(C)+P(D)+P(E)=1. While each probability may take infinitely many values, in a uniform distribution, P(A)=P(B)=P(C)=P(D)=P(E)=⅕, because a uniform distribution introduces the least bias. Suppose further that half of the posts generating a positive reaction comprise the terms A and B, i.e., P(A)+P(B)=½. Then, a uniform assignment is P(A)=P(B)=¼, P(C)=P(D)=P(E)=⅙. Suppose also, that a quarter of the posts generating a positive reaction comprise the term C, i.e., P(C)=¼. Then, the uniform assignment is P(A)=P(B)=¼, P(C)=¼ P(D)=P(E) =⅛. As the number of terms and constraints increase, the uniform assignment becomes complicated because it is difficult to find such a distribution satisfying the numerous constraints, so conflicts may arise. The MaxEnt model overcomes the conflicts by accommodating as many constraints as necessary, while omitting constraints that cause the uniform assignments to violate the constraints. Hence, the constraints that contribute least to entropy are omitted. Hence, as describe above in the "Adobe" example, the conditional probabilities related to those terms that maximize the conditional entropy are added to the model (and the other terms are omitted).

Once the model is built, a user may enter a proposed post via the user interface 126. The reaction predictor 134 uses the prediction model 144 to predict a reaction to the proposed post. The proposed post is cleaned of all stop words and bigrams are extracted for the post. For each performance indicator or sentiment for which a prediction is being made, a reaction is calculated by calculating the conditional probability for each term and bigram in the cleaned post. The reaction predictor 134 may display via the user interface 126, the predicted reaction using various methods of visualization of the prediction. In some embodiments, a suggestion module 136 displays a list of suggested terms that may be used to make the reaction to the proposed post more positive. The suggestion module 136 accesses a lexical database 146 to find one or more synonyms for terms that receive negative sentiments. A term ranking module 138 ranks the synonyms found in the lexical database 146 so the suggestion module 136 may display the suggested synonyms in order of sentiment, such as most positive to least positive.

Figure 2:
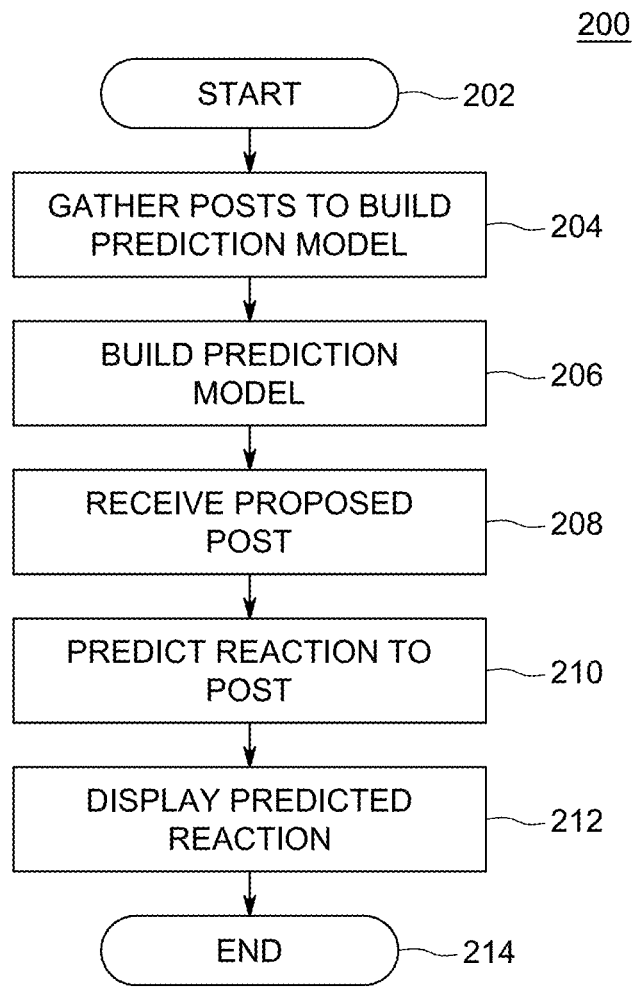
FIG. 2 depicts a method for predicting community reaction to a post, as performed by the prediction engine of FIG. 1, according to one or more embodiments of the invention.

FIG. 2 depicts the method 200 for predicting community reaction to a post as performed by the prediction engine 119 of FIG. 1, according to one or more embodiments of the invention. The method 200 gathers posts from the social community site and builds a prediction model. When the method 200 receives a proposed post, the method 200 displays a predicted reaction to the proposed post.

The method 200 starts at step 202 and proceeds to step 204. At step 204, the method 200 gathers the posts needed to build a prediction model as described in further detail with respect to FIG. 3 below. The method 200 proceeds to step 206, where the method 200 builds a prediction model as described in further detail with respect to FIG. 4 below. The method 200 proceeds to step 208, where the method 200 receives a proposed post. The proposed post may be any text requiring evaluation. The method proceeds to step 210, where the method 200 predicts a reaction to the proposed post as described in further detail with respect to FIG. 5 below.

The method 200 proceeds to step 212 where the predicted reaction is displayed. The various embodiments in which the predicted reaction is displayed are described in further detail with respect to FIGS. 8 and 10, below. The various displays may be used separately or in combination. The method 200 proceeds to step 214 and ends.

Figure 3:
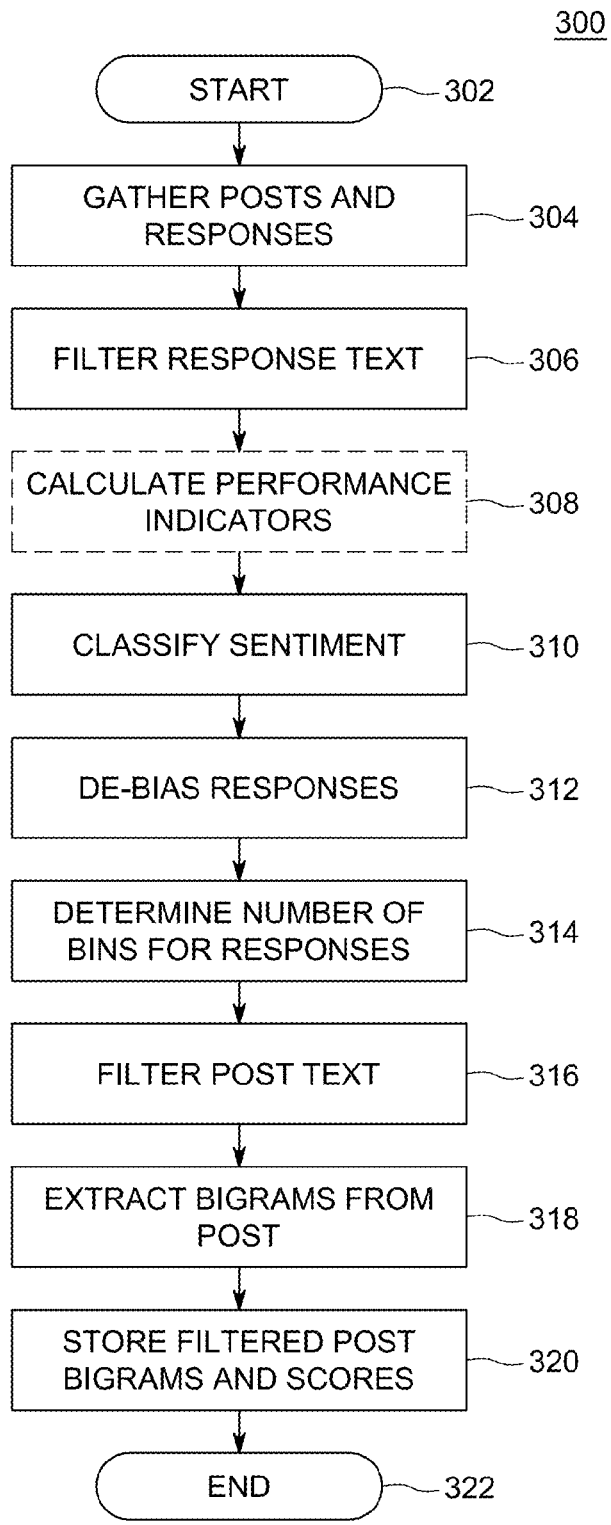
FIG. 3 depicts a method for preparing data that is used to build a prediction model as performed by the text processor of FIG. 1, according to one or more embodiments of the invention.

FIG. 3 depicts the method 300 for preparing posts that are used to build a prediction model as performed by model generator 120 of FIG. 1, according to one or more embodiments of the invention. The method 300 gathers posts from one or more sources, such as from online social community sites, calculates scores for various metrics for the responses to the posts, and stores the scores.

The method 300 starts at step 302, and proceeds to step 304. At step 304, the method 300 gathers posts from an online social community. The method 300 gathers posts and responses from a community, using various methods of data gathering well known to those skilled in the art. In some embodiments, the method 300 uses a list of universal resource locators (URLs). The method 300 may send Hypertext Transfer Protocol (HTTP) requests to retrieve the posts. Other data protocols, formats, and sources may also be used to gather posts.

The method 300 proceeds to step 306, where the method 300 filters the text of the gathered responses to the posts. The method 300 filters out words in the response that are contained in a file of stop words. Stop words are words such as a, an, the, is, at, which, on, and the like that do not convey sentiment in the response. The method 300 also removes any punctuation present in the response.

In some embodiments, the method 300 optionally proceeds to step 308 where the method 300 calculates performance indicators for the filtered responses as described in further detail with respect to FIG. 7, below.

The method 300 proceeds to step 310, where the method 300 determines a sentiment for each response to a post. Each filtered response to a post is input into a sentiment classifier. The sentiment classifier is a third party software that evaluates the positive or negative expression of a response based on each term in the filtered response. The sentiment classifier accepts text as input and returns a score that represents how positive or negative is the expression of sentiment associated with the response. The sentiment classifier then returns a score within a predefined range, for example from −1 to +1, wherein −1 represents extremely negative, +1 represents extremely positive, and 0 represents neutral. In some embodiments, the sentiment classification step 310 is included as a portion of the performance indicator calculation step 308.

The method 300 proceeds to step 312, where the method 300 de-biases the scores calculated by the performance indicator estimator and the sentiment classifier. De-biasing removes the effect of an extremely positive or extremely negative response on the overall score of a post. In some embodiments the method 300 starts the de-biasing process by finding the mean and standard deviation for the responses to the post. Using the mean and standard deviation, the method 300 recalculates a normalized score for each score calculated by the sentiment classifier using the formula:

$$r'=(r-m)/s$$

where r' is the normalized score,
r is the score returned by the classifier,
m is the mean of the scores returned by the classifier, and
s is the standard deviation of the scores returned by the classifier.

The method 300 averages the normalized scores to create an overall score for the post.

For example, if a post has twelve responses and the sentiment classifier returns sentiment scores of −0.75, 0.0, 0.0, 0.1, 0.1, 0.1, 0.2, 0.3, 0.2, −0.1, 0.2, and −0.1 for the twelve responses, respectively, the calculated mean of these twelve scores is 0.02, indicating the overall response to the post was neutral. However, eleven of the twelve responses earned sentiment scores of −0.1 or higher. Thus, if the scores were normalized before calculating the mean score, the mean score would be 0.10, thereby showing a truer indication that the overall response to the post was somewhat positive.

The method 300 optionally proceeds to step 314, where the method 300 determines a number of bins (or intervals) into which the data scores will be binned. The method 300 calculates the skewness of the distribution of the normalized scores using various statistical methods known to those skilled in the art and determines a number of intervals based on the skewness. For example, for sentiment prediction, if the method 300 determines the scores are not skewed, six bins (or intervals) may be evenly distributed, such as: extremely negative for scores of −1.0 to −0.75, moderately negative for scores of −0.75 to −0.50, mildly negative for scores of −0.50 to −0.25, neutral for −0.25 to +0.25, mildly positive for scores of _+0.25 to +0.50, moderately positive for scores of +0.50 to +0.75, and extremely positive for scores of +0.75 to +1.0. However, if the method 300 determines the calculated number of responses distribution is positively skewed, the method 300 may make four bins (or intervals), for example, 0 to 10, 10 to 100, 100 to 1000, and 1000 or more. The method 300 stores the intervals in which the scores fall along with the posts in the file of scored post data.

The method 300 proceeds to step 316, where the method 300 filters the post text in a manner similar to how the method 300 filtered the response text. The method 300 filters words in the post that are contained in a file of stop words. Stop words are words such as a, an, the, is, at, which, on, and the like that do not affect the reaction to the post. The method 300 also removes any punctuation present in the post.

The method 300 optionally proceeds to step 318, where the method 300 extracts bigrams, or consecutive two-word pairs from the post. In some embodiments, the method 300 ranks the pairs according to the frequency of the occurrence of the pair in training data, where the training data comprises all of the posts gathered, from a community. For each pair, the rank is calculated using:

$$k = \frac{\ln(p(x, y))}{\ln(p(x)) * \ln(p(y))}$$

where k is the rank for a particular word pair,
p(x,y) is the empirical probability of x and y occurring in sequence in the training data,
p(x) is the empirical probability of x occurring in the training data,
p(y) is the empirical probability of y occurring in the training data, and
ln[·] denotes the natural or Napierian logarithm function (base e).

The top M word-pairs with the highest scores are joined together and stored with the post in the scored post data.

In other embodiments, the method 300 ranks the pairs by determining the frequency of each individual term in the post. The method 300 calculates the empirical probability of the individual term occurring in the training data for each individual term in the post. The method 300 calculates the mean and standard deviation of the empirical probabilities for all individual terms in the post. The method 300 then determines the frequency of occurrences of all bigrams, or consecutive word-pairs, calculates the empirical probability of the bigram occurring in the training data and if the probability of the bigram occurring is greater than the mean plus the standard deviation of the empirical probabilities for all individual terms in the post, the bigram is selected to be stored with the post.

The method 300 proceeds to step 320, where the method 300 stores the filtered post text and the bigrams with the scored post data. The method 300 proceeds to step 322 and ends.

Figure 4:
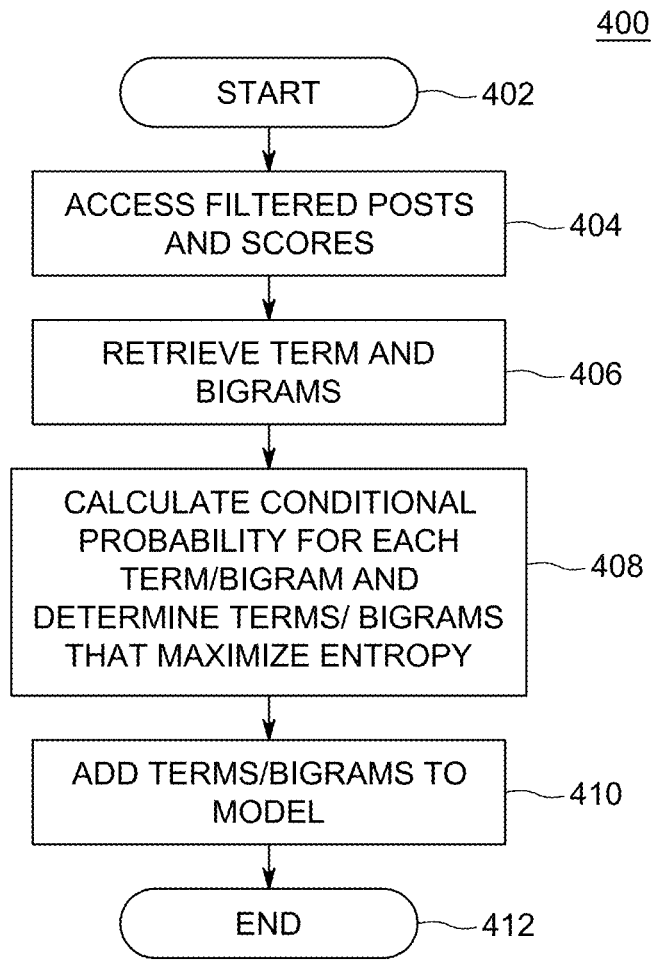
FIG. 4 depicts a flow diagram for a method for building the prediction model as performed by the prediction trainer of FIG. 1, according to one or more embodiments of the invention.

FIG. 4 depicts a flow diagram for a method 400 for building the prediction model as performed by the prediction trainer 130 of FIG. 1 according to one or more embodiments of the invention. The method 400 takes the scored post data and uses the data to build a prediction model. The method 400 starts at step 402 and proceeds to step 404 where the method 400 accesses the scored post data.

The scored post data comprises the filtered post, bigrams, normalized scores, and calculated metrics. The method 400 proceeds to step 406, where the method 400 retrieves all one word terms and stored bigrams for the filtered post. The method 400 proceeds to step 408 where the method 400 calculates the conditional probability for each term and each bigram in the post for one or more of performance indicators and sentiment. Conditional probability is determined by the probability of A given B as:

$$P(A \mid B) = \frac{P(A \cap B)}{P(B)}$$

where P(A∩B) is the probability of A and B occurring, and

P(B) is the probability of B occurring.

For example, for a sentiment, if a term in the post is "Adobe" and the method 400 calculates the conditional probability of a post being negative given the post contains the term "Adobe". The method 400 calculates the conditional probability by determining the number of posts that contain the term "Adobe" that are negative and divides that number by the total number of posts that contain the term "Adobe". Similarly, for a performance indicator, such as number of responses for a post that fall into the 0-10 interval, the method 400 calculates the conditional probability by determining the number of posts containing the term "Adobe" that have a number of responses between 0-10 and divides that by the total number of posts that contain the term "Adobe". The method 400 calculates the conditional probability for each interval (or bin) for which total posts are calculated, for example 10-100, 100-1000, and 1000 or more and determines the terms or bigrams for which the conditional entropy is at a maximum. Maximum conditional entropy is determined using any algorithm known in the art that can solve the maximum entropy problem, such as the Improved Iterative Scaling Algorithm for computing maximum-likelihood estimates.

The method 400 proceeds to step 410, where the method 400 adds the terms and bigrams to the model for all terms and bigrams for which the conditional entropy is maximized. The method 400 proceeds to step 412 and ends.

Figure 5:
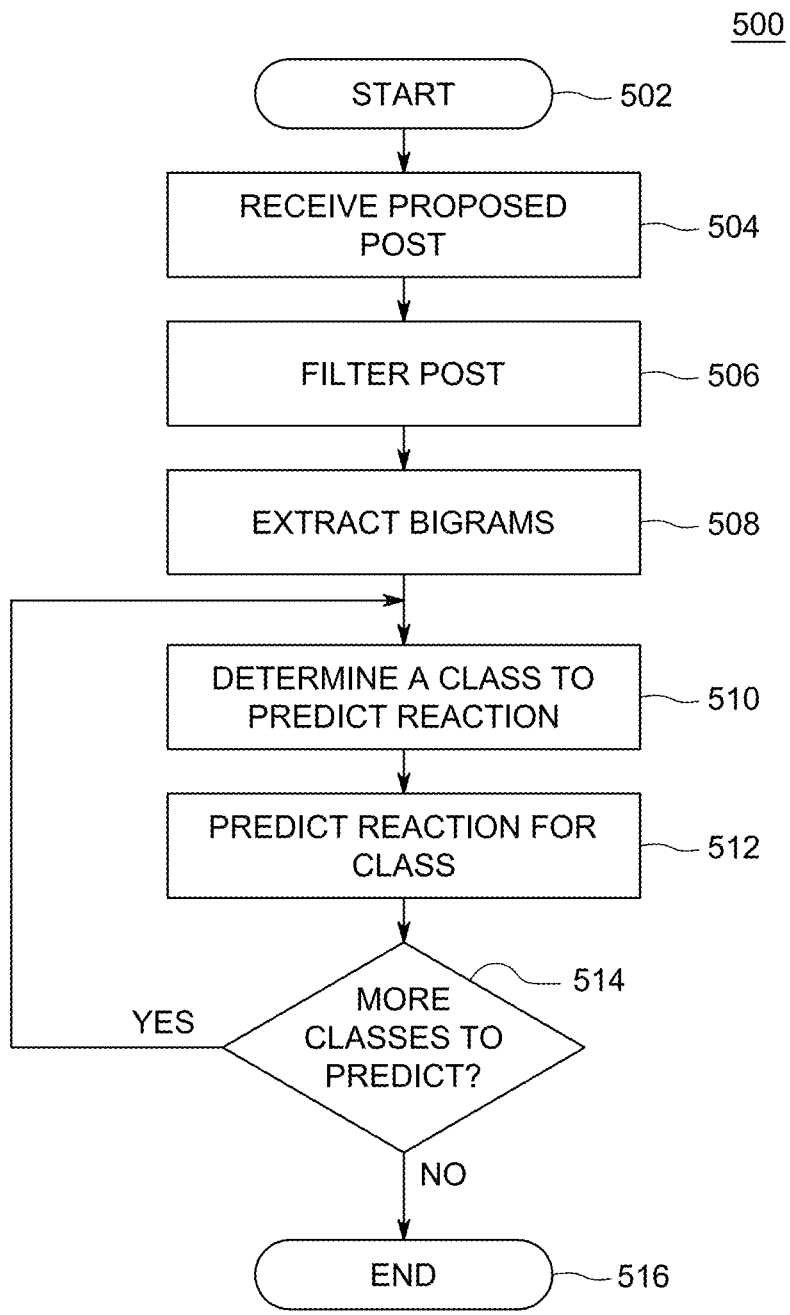
FIG. 5 depicts a flow diagram for a method for predicting a reaction to a post as performed by the reaction predictor of FIG. 1, according to one or more embodiments of the invention.

FIG. 5 depicts a flow diagram for a method 500 for predicting a reaction to a post as performed by the reaction predictor 134 of FIG. 1 according to one or more embodiments of the invention. The method 500 receives a proposed post and predicts a community reaction to the post. The method 500 starts at step 502 and proceeds to step 504.

At step 504, the method 500 receives a proposed post. For example, a proposed post may be, "Woolly mammoth clone! Scientists sign a deal to bring the beast back from extinction." The method 500 proceeds to step 506 where the method 500 filters the post, similar to how the responses were filtered in step 306 of FIG. 3 above by removing stop words and punctuation. The filtered proposed post may be, "Woolly Mammoth Clone Scientist Sign Deal Bring Beast Back From Extinction".

The method 500 proceeds to step 508, where the method 500 extracts the bigrams from the proposed post similar to how bigrams are extracted in step 318 of FIG. 3, above. Bigrams may be "Woolly Mammoth" and "Sign Deal". The method 500 proceeds to step 510 where the method 500 selects a class for predicting a reaction. The class may be a positive or negative score for a sentiment or one or more of the performance indicators. The method 500 proceeds to step 512, where the method 500 predicts the reaction for the sentiment or performance indicator. For example, based on the prediction model, the method 500 may predict the bigram "Woolly Mammoth" creates a neutral reaction, the term 'Clone" creates an extremely negative reaction, the term "Scientists" creates a neutral reaction, the bigram "Sign Deal" creates a somewhat positive reaction, the term "Bring" creates a neutral reaction, the term "Beast" creates a strong negative reaction, the term "Back" creates a somewhat positive reaction, the term "From" creates a neutral reaction, and the term "Extinction" creates a very negative reaction.

The sentiments for the responses are averaged and the sentiments are binned into the intervals defined in step 314 of FIG. 3, above. The method 500 proceeds to step 514, where the method 500 determines whether there are more sentiments or performance indicators for which a reaction needs to be predicted. For example, a half-life for each term and bigram is predicted, averaged and binned. Predictions are made for each performance indicator used to build the prediction model. If the method 500 determines no more reactions need to be predicted, the method 500 proceeds to step 516 and ends. However, if the method 500 determines there are reactions to be predicted, the method 500 proceeds to step 510 and iterates until all reactions have been predicted. The method 500 proceeds to step 516 and ends.

Figure 6:
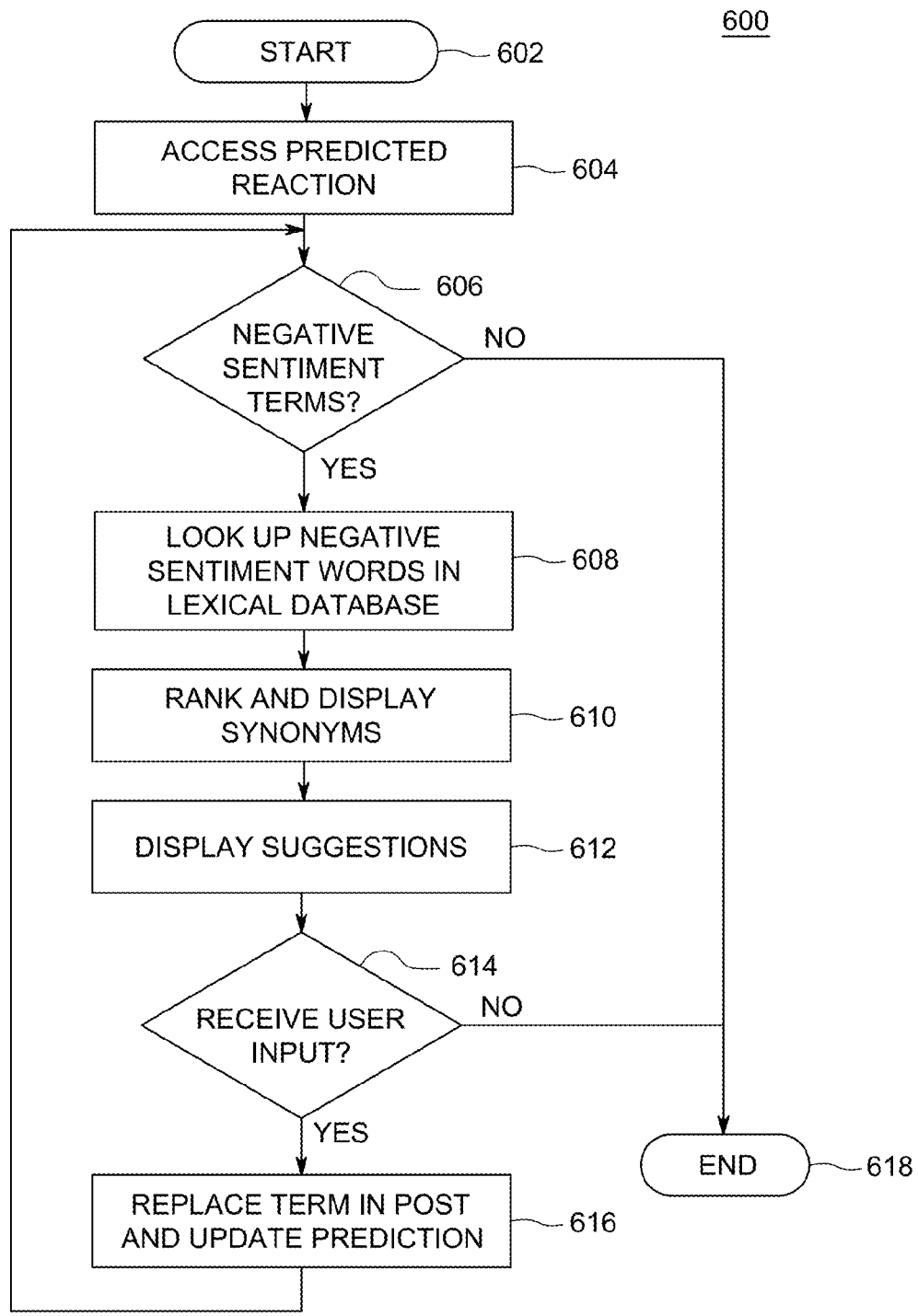
FIG. 6 depicts a flow diagram for a method for providing suggestions to make a reaction to a proposed post more positive, as performed by the suggestion module and the term ranking module of FIG. 1, according to one or more embodiments of the invention.

FIG. 6 depicts a flow diagram for a method 600 for providing suggestions to make a reaction to a proposed post more positive as performed by the suggestion module 136 and the term ranking module 138 of FIG. 1 according to one or more embodiments of the invention. The method 600 determines if there are any terms in the filtered post that are associated with a predicted negative response, in some embodiments, for example a predicted negative sentiment, and provides suggestions of synonyms to the term with the negative sentiment, where the suggested synonyms have a less negative sentiment associated with them.

The method 600 starts at step 602 and proceeds to step 604. At step 604, the method 600 accesses the post and the predicted reaction. The method 600 proceeds to step 606, where the method 600 determines whether any terms exist in the post that are associated with a negative sentiment. For example, the term "Extinction" in the current example was predicted to create a very negative reaction. If no terms in the post that has a negative sentiment, the method 600 proceeds to step 618 and ends. However, if the method 600 determines a term in the post is associated with a negative sentiment, the method 600 proceeds to step 608.

At step 608, the method 600 retrieves synonyms for the negative sentiment term in a lexical database. The lexical database contains synonyms for the negative sentiment term in a variety of contexts. For example, synonyms for the term "Extinction" may be "extermination" in the context of "complete annihilation", "defunctness" in the context of "no longer in existence", or "decimation" in the context of "the act of extinguishing". The method 600 proceeds to step 610, where the method 600 ranks the synonyms based on calculated conditional probabilities for each term that maximize entropy. The method 600 may rank the synonyms from most positive to most negative as "defunctness", decimation", "complete annihilation". The method 600 proceeds to step 612 where the method 600 displays the suggestions to a user via a user interface. The method 600 proceeds to step 614, where the method 600 determines whether the user has selected a suggestion to replace a term in the proposed post. The user may select a suggestion by clicking, highlighting or otherwise interacting with a displayed suggested synonym. If the method 600 determines the user has not selected a suggested synonym, the method 600 proceeds to step 618 and ends. However, if the method 600 determines the user has selected a suggested synonym, the method 600 proceeds to step 616.

At step 616, the method 600 replaces the negative sentiment term in the post with the selected suggested synonym to create a revised proposed post. The method 600 inputs the revised proposed post into the reaction predictor of method 500 and displays the reaction to the revised proposed post. The method 600 then proceeds to step 606, where the method determines if there are any negative sentiment terms in the revised proposed post. The method 600 iterates until there are no negative sentiment terms in the proposed post or until at step 614 the user chooses to not use any suggestions to make the reaction to the proposed post more positive, at which point the method 600 proceeds to step 618 and ends.

Figure 7:
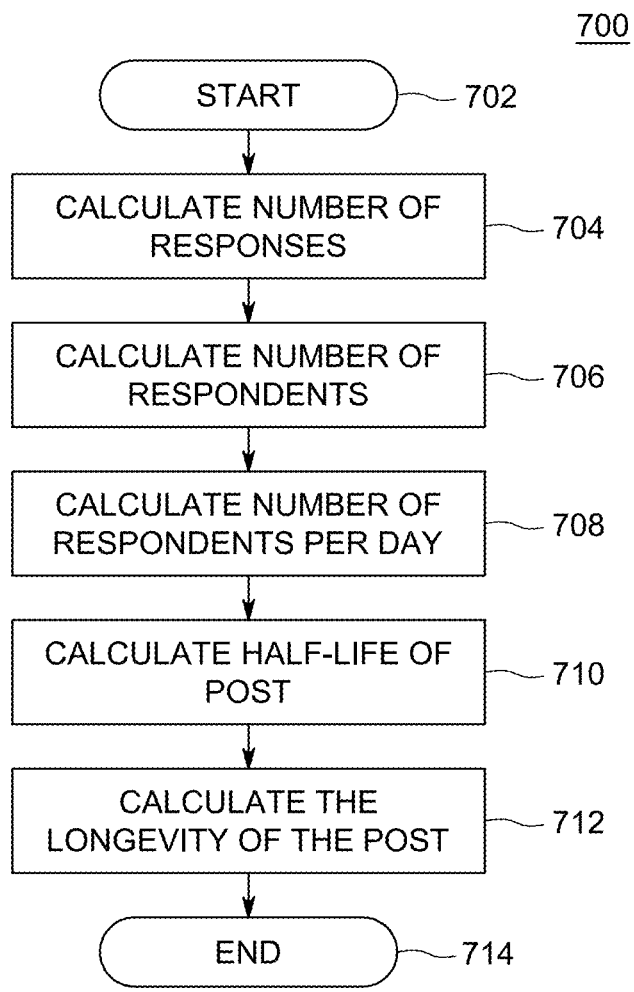
FIG. 7 depicts a flow diagram for a method for calculating performance indicators as performed by the performance indicator estimator of FIG. 1, according to one or more embodiments of the invention.

FIG. 7 depicts a flow diagram for a method 700 for calculating performance indicators as performed by the performance indicator estimator 122 of FIG. 1, according to one or more embodiments of the invention. The method 700 calculates a number of responses to the post, a number of responders each day to the post, a rate of growth or decline of responders to the post, the longevity of a post, meaning how long the post has been active and attracted responders. It is appreciated that although four performance indicators are calculated, other embodiments of the present disclosure envision calculating additional possible performance indicators. The performance indicators that are calculated when the prediction model is built are the performance indicators that will be predicted when a proposed post is input for a predicted reaction. As such, when a proposed post is input into the prediction model, before it is posted on a live community site, the model predicts whether the post will receive a positive or negative response in addition to a number of responses that will be received for the post, the number of responders the post will have, the number of responses that will be received for a given time interval, such as each day, each hour, and the like.

The method 700 starts at step 702 and proceeds to step 704. At step 704, the method 700 calculates the number of responses for the post. The method 700 proceeds to step 706, where the method 700 calculates the total number of respondents who provided the responses. The number of respondents may be different from the number of responses in the event that a respondent published multiple responses to a post. Each response contains a screen name of a respondent. The method 700 counts the number of unique screen names that are associated with the responses. The method 700 proceeds to step 708 where the method 700 calculates the number of respondents for each day since the post was published. In addition to a screen name, each post contains a date of when the response was published. The method 700 determines the number of unique screen names that published responses each day since the post was published.

The method 700 proceeds to step 710, where the method 700 determines a half-life, meaning the time in which 50% of the posts were published. For example, a post received, 250 responses, where 25 responses were published on day 1, 25 responses were published on day 2: 20 responses were published on day 3, 30 responses were published on day 4, 100 responses were published on day 5, 50 responses were published on day 6, no responses were published on day 7, and no responses were published on day 8. Of the 250 responses, the half way point, where 125 (or half) of the total responses were published, was on the fifth day. Therefore, the post has a half-life of five days. Often, the half-life may be much shorter, measured in hours or minutes.

The method 700 proceeds to step 712, where the method 700 calculates the longevity of the post, meaning how much time passed between when the post was published and when the last response to the post was published. The method 700 proceeds to step 714 and ends.

Figure 8:
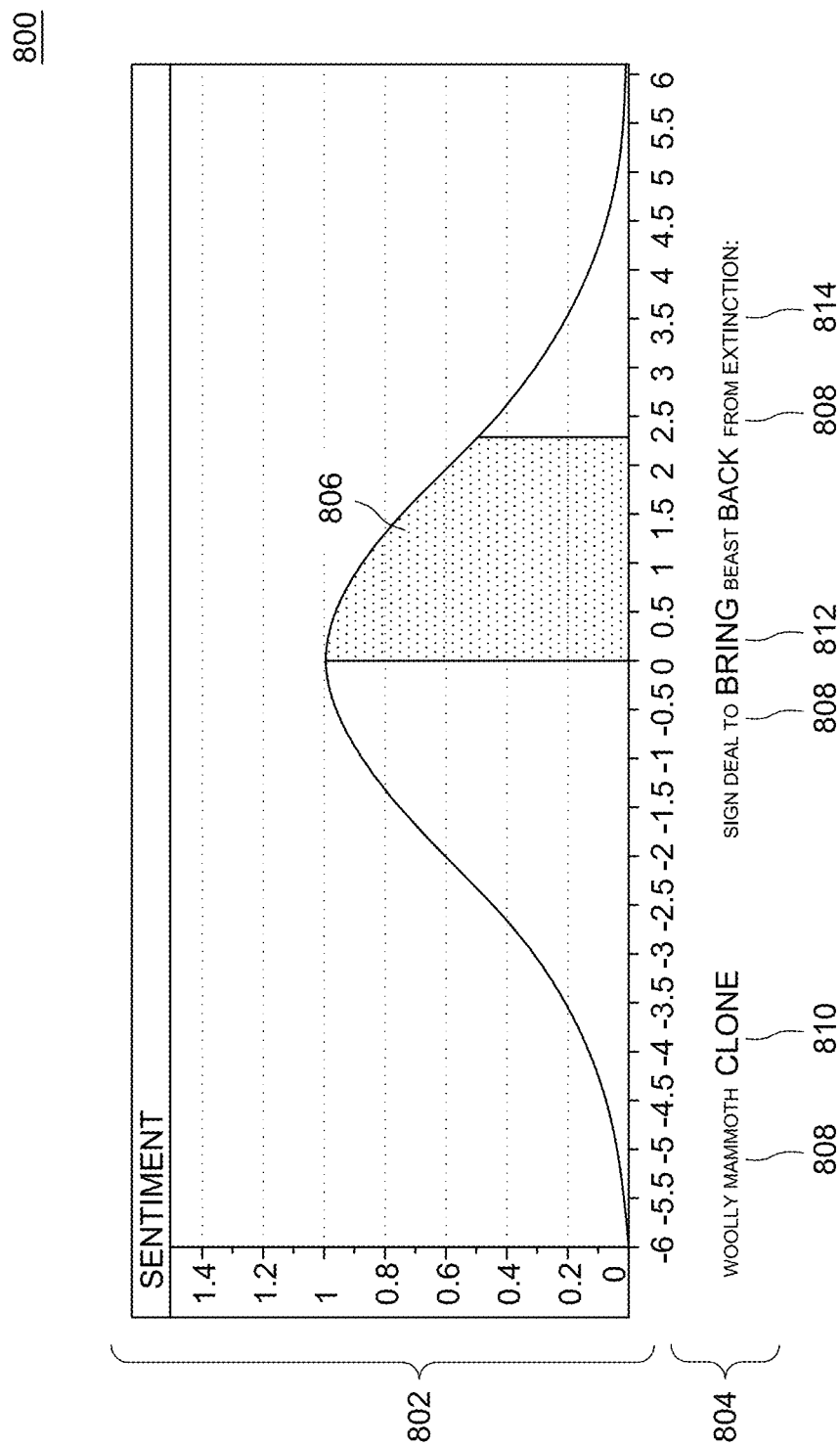
FIG. 8 depicts a visualization of a community reaction prediction, according to one or more embodiments.

FIG. 8 depicts a visualization of a community reaction prediction 800, according to one or more embodiments. The community reaction prediction 800 provides a graphical representation of a community reaction prediction to a proposed post where the prediction model is built to predict a sentiment reaction. The community reaction prediction 800 is divided into two parts, a bell-curve area 802 and a text area 804. The bell curve area 802 provides an indication of the overall sentiment of a proposed post. In some embodiments, a shaded region 806 begins at 0 on the x-axis. The shaded region 806 begins at 0 on the x-axis and proceeds to the right. A shaded region 806 beginning at 0 and spanning to the right on the x-axis indicates a positive sentiment. Conversely, a shaded region 806 beginning at 0 and spanning to the left on the x-axis indicates a negative sentiment. The width of the shaded region 806 is proportional to the level of confidence of the community reaction prediction. In some embodiments, the color of the shaded region 806 indicates the sentiment. For example, a region shaded in green may indicate a positive sentiment, while a region shaded in red may indicate a negative sentiment.

The text area 804 of the community reaction prediction 800 displays the text of the filtered post. In some embodiments, the terms of the filtered post are displayed in different colors to indicate whether a term is predicted to evoke a neutral reaction, a positive reaction, or a negative reaction. For example, terms that are predicted not to contribute to the overall sentiment of the post (i.e., terms that have a neutral sentiment) are displayed in a neutral color, for example, black. Terms that are predicted to evoke a positive sentiment may be displayed in green and terms that are predicted to evoke a negative sentiment may be displayed in red. The color associated with the sentiment is consistent in the bell-curve area 802 and in the text area 804. The font size of the term indicates the extremity of the reaction.

As displayed in the community reaction prediction 800, the terms "Woolly", "Mammoth", "To", and "From" 808 are predicted to not contribute to the overall sentiment of the post, i.e., the terms 808 are predicted to have a neutral sentiment. These neutral sentiment terms 808 are displayed in a small font in a black color. The term "Clone" 810 is predicted to evoke a very positive sentiment and is therefore displayed in a green color with a larger font. The term "Bring 812 is predicted to evoke an extremely positive sentiment and is therefore displayed in a green color with a larger font than the term "Clone" 810. Lastly, the term "Extinction" 814 is predicted to evoke a mildly negative sentiment and is therefore displayed in a small font, but in a red color.

Figure 9:
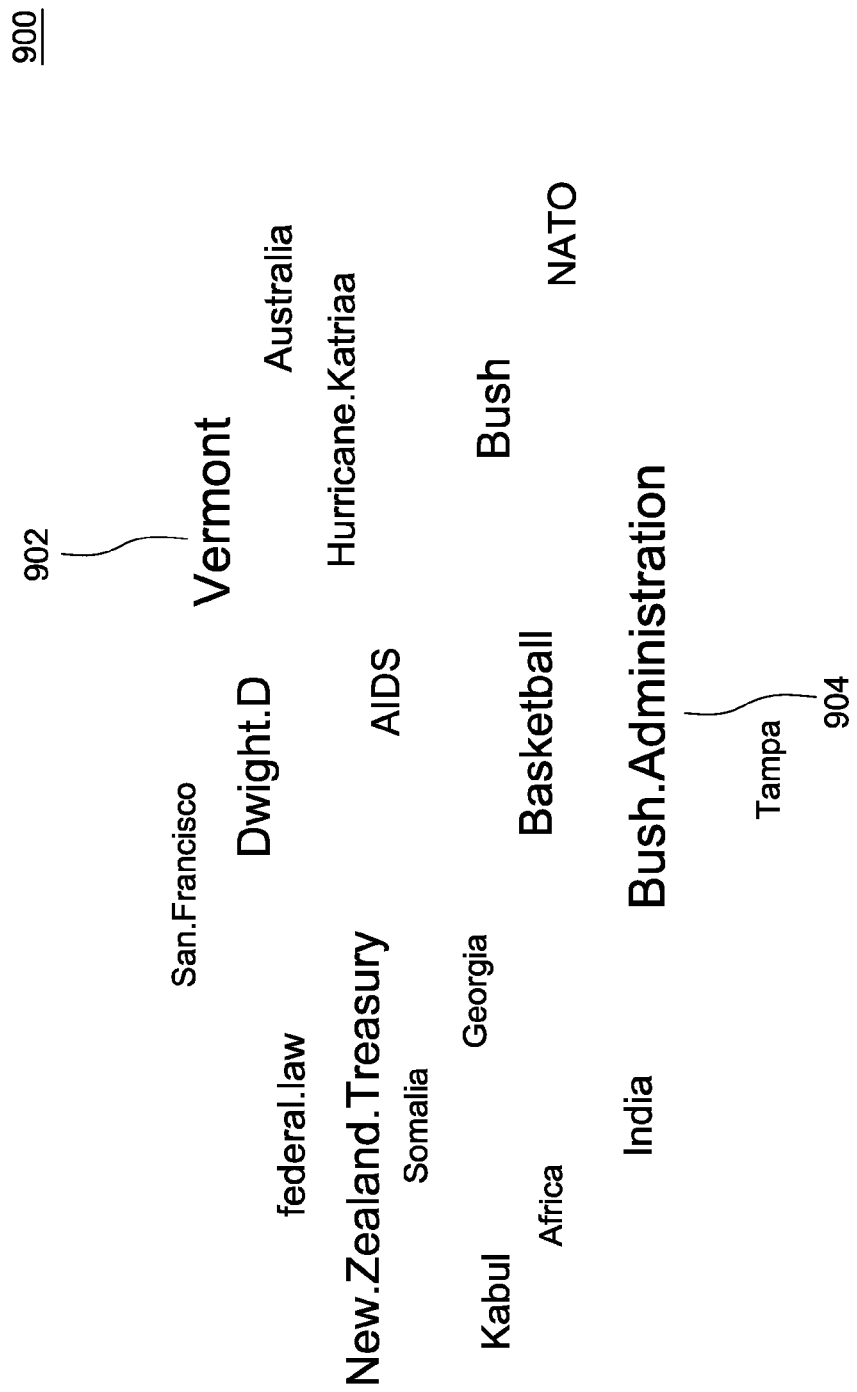
FIG. 9 depicts a visualization of a sentiment reactions to a plurality of terms in collected posts, according to one or more embodiments.

FIG. 9 depicts a visualization of sentiment reactions 900 to a plurality of terms in collected posts, according to one or more embodiments. The community reaction 900 provides a graphical representation of sentiment reactions by a community to a plurality of collected posts. The terms, bigrams (and in some embodiments n-grams, that is, a sequence of n contiguous phonemes, syllables, letters or words) from collected posts from a community are displayed in a three-dimensional (3D) cloud. The color and font of the term, bigram, or n-gram indicate the sentiment evoked in response to posts containing the term, bigram, or n-gram. As discussed previously, a color, for example, green indicates a positive sentiment and a different color, for example, red indicates a negative sentiment. The font size indicates the probability of the reaction. For example, if the term "Vermont" 902 is displayed in green in a large font, the term "Vermont" has a high probability of evoking a positive reaction. Likewise, if the bigram "Bush.Administration" 904 is displayed in red in a small font, the bigram "Bush.Administration" 904 has a probability of evoking a negative response. In some embodiments, the location of the term in the 3D cloud has no particular significance.

A user may interact with a term, bigram, or n-gram in the cloud by clicking, highlighting, or otherwise interacting with the term, bigram, or n-gram. In some embodiments, interacting with the term, bigram, or n-gram displays posts that contributed to the sentiment and hyperlinks to the displayed posts.

Figure 10:
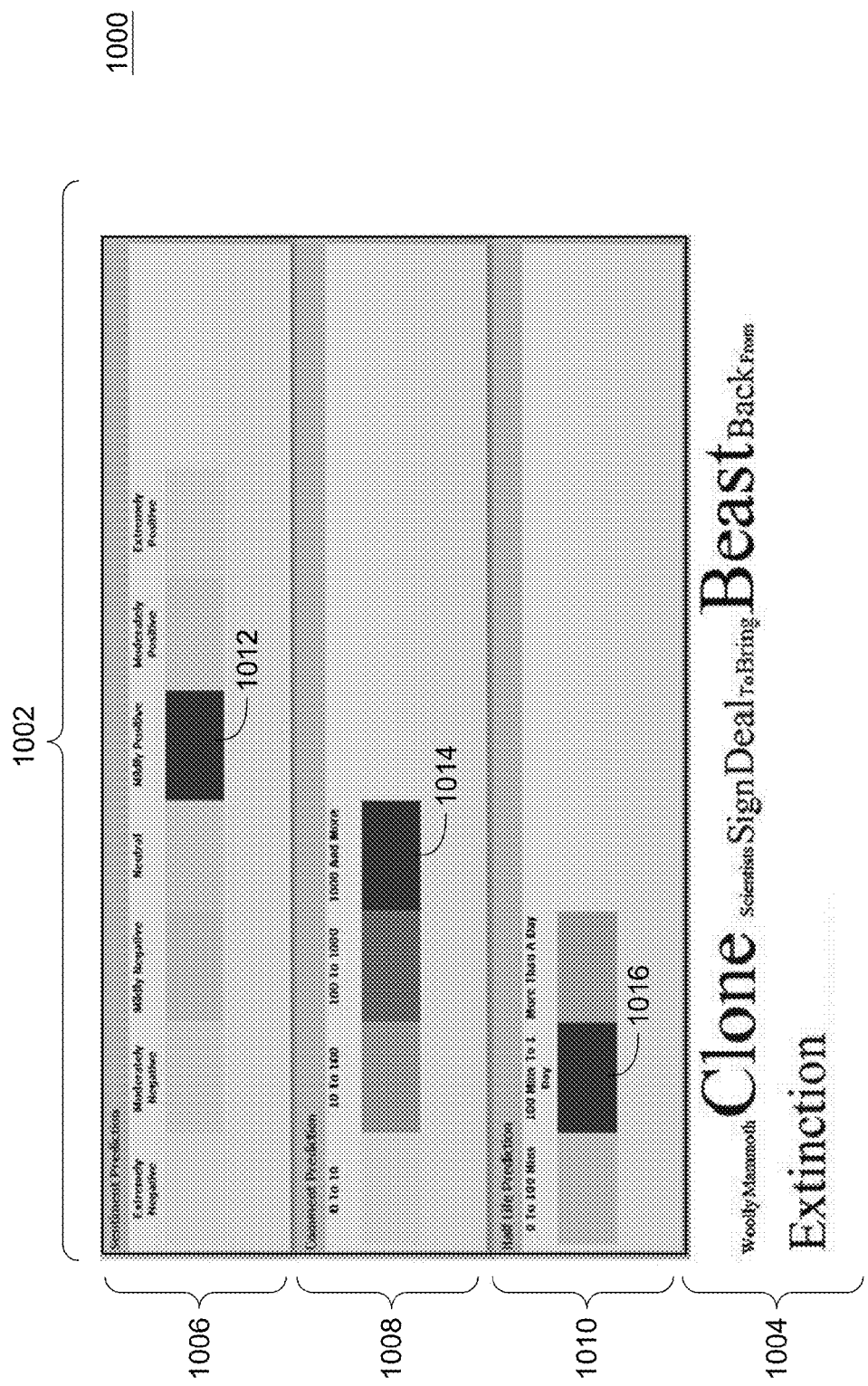
FIG. 10 depicts a visualization of a community reaction prediction to a proposed post, according to one or more embodiments of the invention.

FIG. 10 depicts a visualization of a community reaction prediction 1000 to a proposed post, according to one or more embodiments of the invention. The community reaction prediction 800 is divided into two parts, a binning area 1002 and a text area 1004. The binning area 1002 is divided into areas for a plurality of performance indicators. In this example, the binning area 1002 is divided into a sentiment prediction area 1006, a comment prediction area 1008, and a half-life prediction area 1010. Each area 1006, 1008, and 1010 is divided into various bins, where the bins are displayed in varying shades of a color, for example, green, where the shade indicates the confidence the response to the proposed post falls into the particular bin.

The text area 1004 of the community reaction prediction 1000 displays the text of the filtered post. In some embodiments, the terms of the filtered post are displayed in different colors to indicate whether a term is predicted to evoke a neutral reaction, a positive reaction, or a negative reaction. For example, terms that are predicted not to contribute to the overall sentiment of the post (i.e., terms that have a neutral sentiment) are displayed in a neutral color, for example, black. Terms that are predicted to evoke a positive sentiment may be displayed in green and terms that are predicted to evoke a negative sentiment may be displayed in red. The color associated with the sentiment is consistent in the binning area 1002 and in the text area 1004. The font size of the term indicates the extremity of the reaction.

As displayed in the community reaction prediction 1000, because the mildly positive bin 1012 is shaded darker than the other bins in the sentiment prediction area 1006, it is predicted with great confidence that the proposed post will evoke a mildly positive reaction. Similarly, because the 1000 or more bin 1014 is shaded darker than the other bins in the comment prediction area 1008, it is predicted with great confidence that the proposed post will receive 1000 or more responses. Finally, because the 100 Mins to 1 Day bin 1016 is shaded darker than the other bins in the Half-Life prediction area 1010, it is predicted with great confidence that the proposed post will receive half of its comments within the 100 minutes to 1 day interval.

Figure 11:
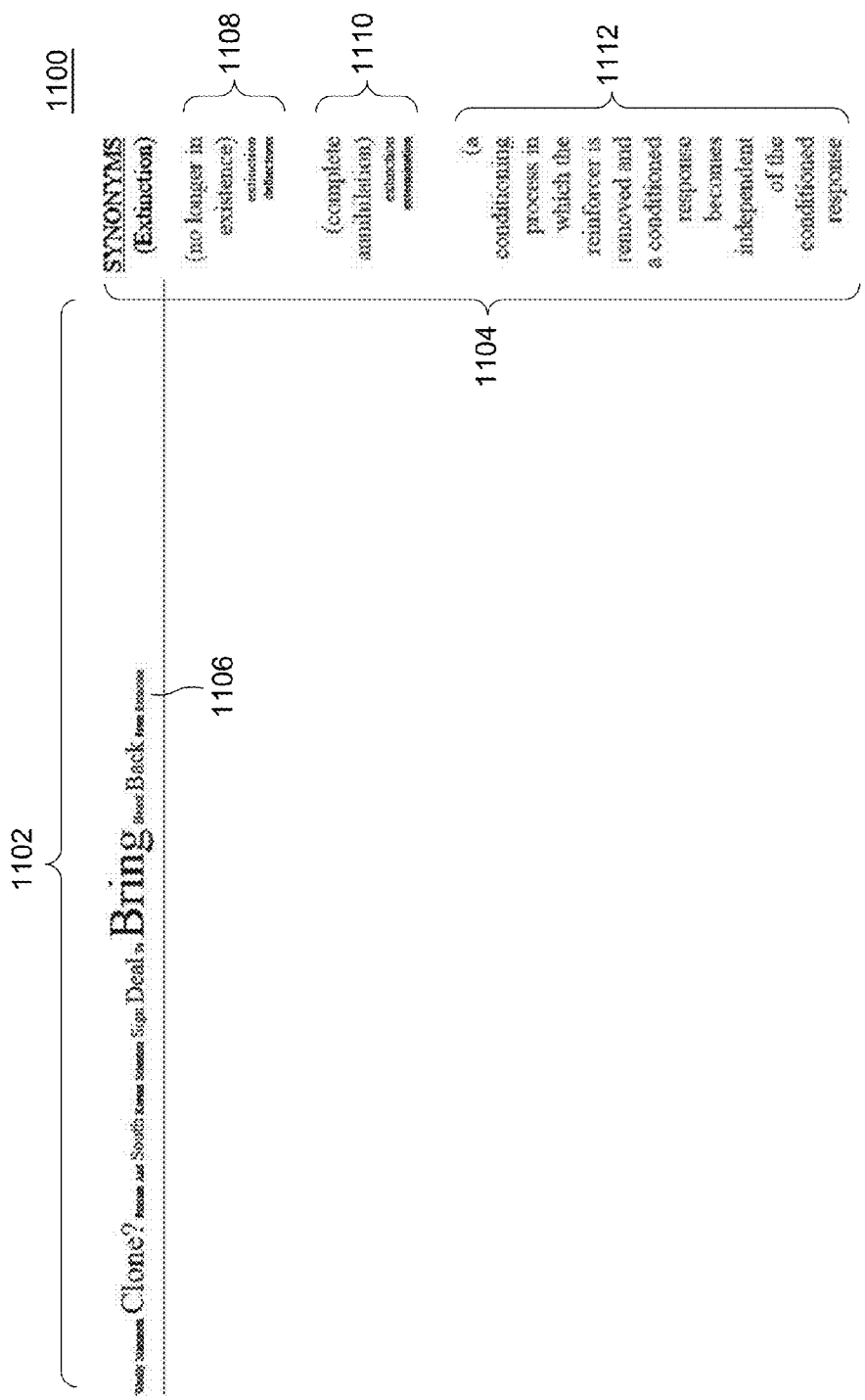
FIG. 11 depicts a visualization of a suggestion of replacement terms to improve a community reaction prediction to a proposed post, according to one or more embodiments of the invention.

FIG. 11 depicts a visualization of a suggestion of replacement terms 1100 to improve a community reaction prediction to a proposed post, according to one or more embodiments of the invention. The community reaction prediction 1100 is divided into two parts, a text area 1102 and a suggestion area 1104. The text area 1102 of the community reaction prediction 1100 displays the text of the filtered post. In some embodiments, the terms of the filtered post are displayed in different colors to indicate whether a term is predicted to evoke a neutral reaction, a positive reaction, or a negative reaction. For example, terms that are predicted not to contribute to the overall sentiment of the post (i.e., terms that have a neutral sentiment) are displayed in a neutral color, for example, black. Terms that are predicted to evoke a positive sentiment may be displayed in green and terms that are predicted to evoke a negative sentiment may be displayed in red. The font size of the term indicates the extremity of the reaction.

The text area 1102 comprises a term "Extinction" 1106. As described in the previous example, the term "Extinction" 1106 is predicted to evoke a slightly negative reaction and is therefore displayed in a color red in a small font. The suggestion area 1104 comprises a list of synonyms for the term "Extinction" 1106 that may make the predicted reaction to the proposed post more positive. The term "Extinction" is looked up in a lexical dictionary and synonyms in a variety of contexts are displayed in the suggestion area 1104 in order of the calculated prediction to evoke a most positive reaction to least positive reaction. Displayed in the suggestion area 1104 are three synonyms for "Extinction" in three different contexts. For example, the term "defunctness" 1108 has the context "no longer in existence". The term "extermination" 1110 has the context "complete annihilation". The term "experimental_extinction" 1112 has the context "a conditioning process in which the reinforcer is removed and a conditioned response becomes independent of the conditioned stimulus".

A user may select a suggested synonym from the suggestion area 1104 by clicking, highlighting, or otherwise interacting with the displayed synonym. When a synonym is selected, the negative sentiment term "Extinction" 1106 is replaced with the selected synonym and a new predicted reaction is displayed in the text area 1102. If other terms exist in the text area 1102 that are predicted to evoke a negative reaction, synonyms for that term are also displayed in the suggestion area 1104.

Figure 12:
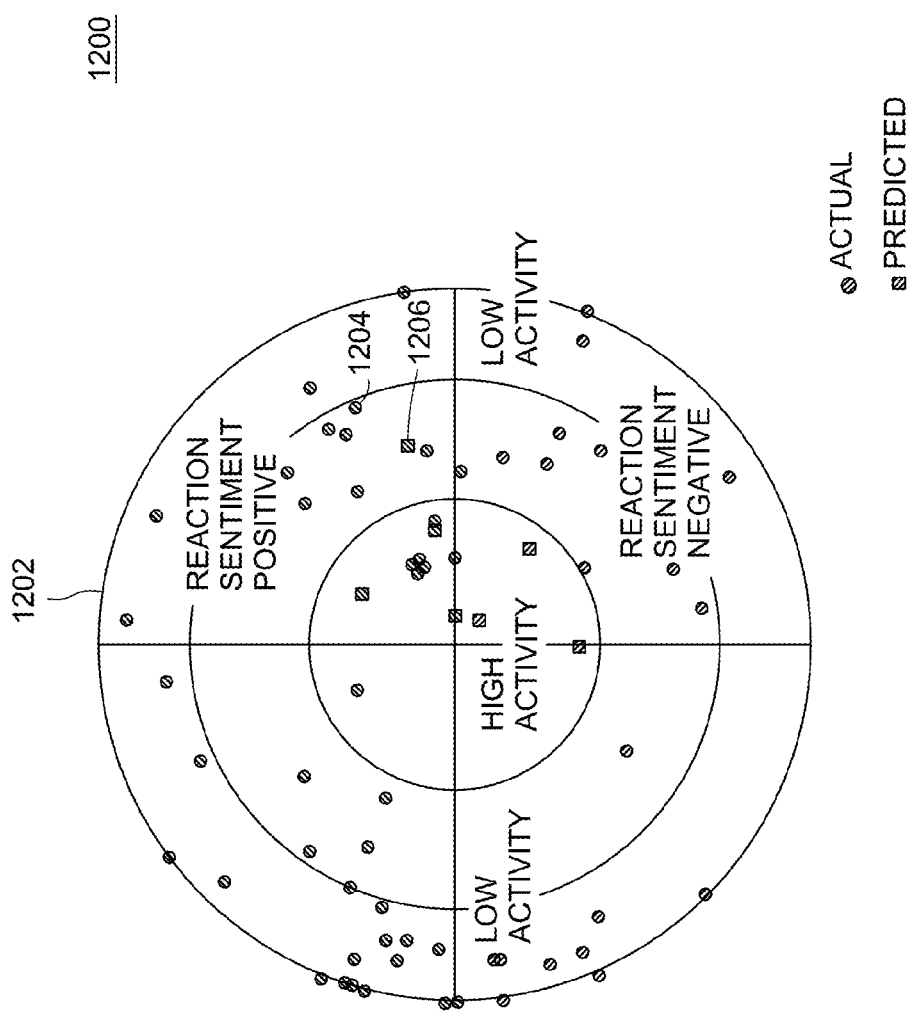
FIG. 12 depicts a visualization of monitoring community reaction, according to one or more embodiments of the invention.

FIG. 12 depicts a visualization of monitoring community reaction 1200, according to one or more embodiments of the invention. The community reaction prediction 1200 provides a graphical representation of community reaction prediction where the prediction model is built to predict a sentiment reaction. The community posts are displayed on a bulls-eye 1202. Two types of posts are displayed on the bulls-eye 1202, older posts 1204 and new posts 1206. Older posts are displayed using an indicator that distinguishes them from newer posts, for example, older posts may be displayed with circles and newer posts may be displayed using squares. Older posts 1204 are posts that are published long enough to get responses and have those responses evaluated. Older posts 1204 are displayed with an indication of the actual sentiment of responses. Newer posts 1206 are posts that are recently published and either have no responses yet or have not had their responses evaluated.

The placement of each post on the bulls-eye 1202 indicates the sentiment of the responses (or the predicted sentiment). The sentiments can be positive or negative. For example, in some embodiments a placement above the horizontal axis of the bulls-eye indicates a positive sentiment, and a placement below the horizontal axis indicates a negative sentiment. The angle at which dot is placed relative to the horizontal axis is proportional to the strength of the sentiment. The radius of the bulls-eye 1202 is inversely proportional to the number of comments received for the post.

As responses for new posts are gathered and evaluated, their placement on the bulls-eye is updated and the indicator is changed. For example, the square that represents a prediction reaction will be replaced by a circle that represents an actual reaction. A user may select points displayed on the bulls-eye to, for example, navigate to the actual post, view prediction statistics, or to take other actions, such as replying to the post.

The embodiments of the present invention may be embodied as methods, apparatus, electronic devices, and/or computer program products. Accordingly, the embodiments of the present invention may be embodied in hardware and/or in software (including firmware, resident software, microcode, etc.), which may be generally referred to herein as a "circuit" or "module". Furthermore, the present invention may take the form of a computer program product on a computer-usable or computer-readable storage medium having computer-usable or computer-readable program code embodied in the medium for use by or in connection with an instruction execution system. In the context of this document, a computer-usable or computer-readable medium may be any medium that can contain, store, communicate, propagate, or transport the program for use by or in connection with the instruction execution system, apparatus, or device. These computer program instructions may also be stored in a computer-usable or computer-readable memory that may direct a computer or other programmable data processing apparatus to function in a particular manner, such that the instructions stored in the computer usable or computer-readable memory produce an article of manufacture including instructions that implement the function specified in the flowchart and/or block diagram block or blocks.

The computer-usable or computer-readable medium may be, for example but not limited to, an electronic, magnetic, optical, electromagnetic, infrared, or semiconductor system, apparatus, device, or propagation medium. More specific examples (a non exhaustive list) of the computer-readable medium include the following: hard disks, optical storage devices, a transmission media such as those supporting the Internet or an intranet, magnetic storage devices, an electrical connection having one or more wires, a portable computer diskette, a random access memory (RAM), a read-only memory (ROM), an erasable programmable read-only memory (EPROM or Flash memory), an optical fiber, and a compact disc read-only memory (CD-ROM).

Computer program code for carrying out operations of the present invention may be written in an object oriented programming language, such as Java®, Smalltalk or C++, and the like. However, the computer program code for carrying out operations of the present invention may also be written in conventional procedural programming languages, such as the "C" programming language and/or any other lower level assembler languages. It will be further appreciated that the functionality of any or all of the program modules may also be implemented using discrete hardware components, one or more Application Specific Integrated Circuits (ASICs), or programmed Digital Signal Processors or microcontrollers.

The foregoing description, for purpose of explanation, has been described with reference to specific embodiments. However, the illustrative discussions above are not intended to be exhaustive or to limit the invention to the precise forms disclosed. Many modifications and variations are possible in view of the above teachings. The embodiments were chosen and described in order to best explain the principles of the present disclosure and its practical applications, to thereby enable others skilled in the art to best utilize the invention and various embodiments with various modifications as may be suited to the particular use contemplated.

Example Computer System

Figure 13:
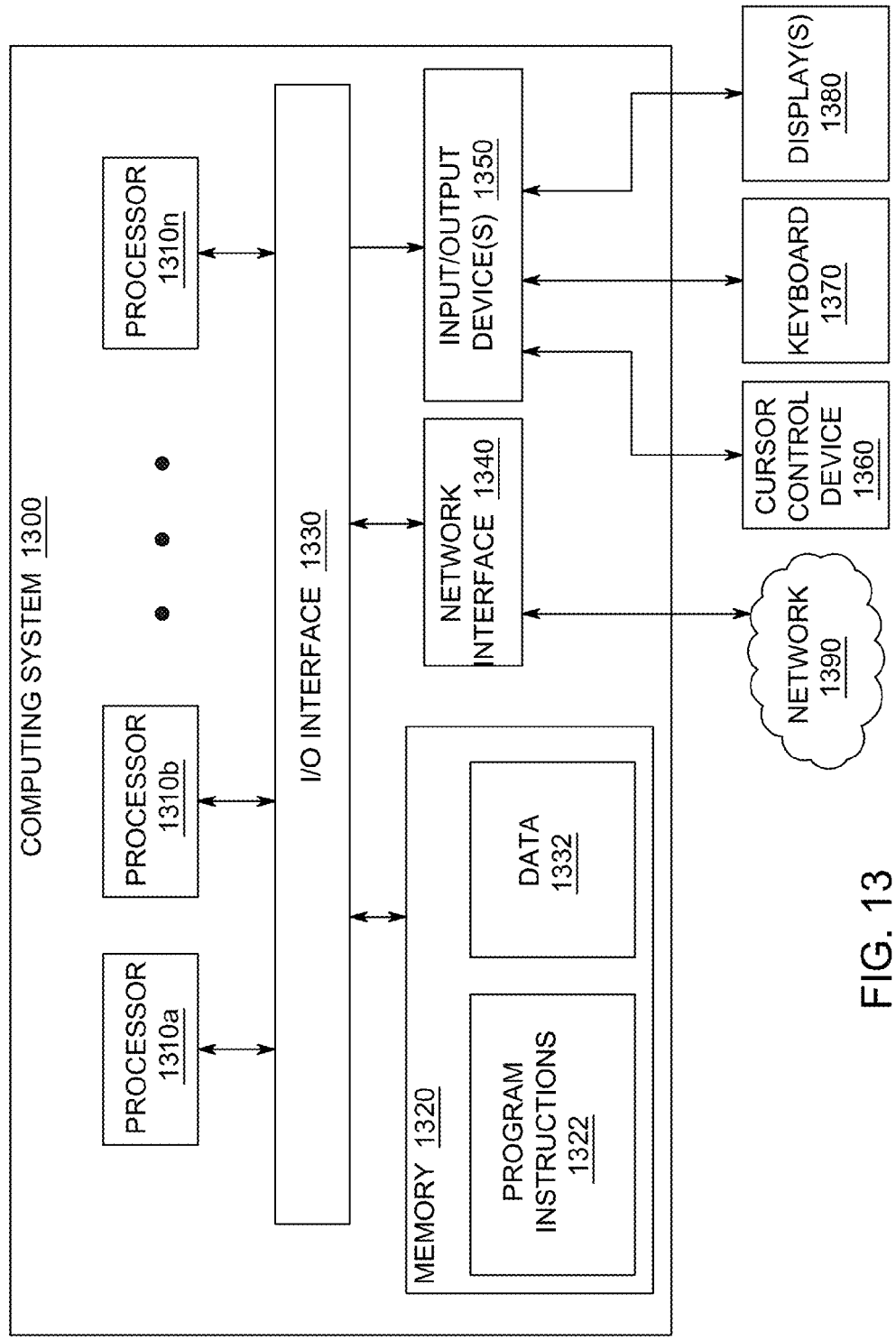
FIG. 13 depicts a computer system that can be utilized in various embodiments of the present invention, according to one or more embodiments of the invention.

FIG. 13 depicts a computer system that can be used to implement the methods of FIGS. 2-4 in various embodiments of the present invention, according to one or more embodiments of the invention. FIG. 13 depicts a computer system that can be utilized in various embodiments of the present invention to implement the prediction server 102, according to one or more embodiments.

Various embodiments of method and apparatus for prediction of community reaction to a post for a social community, as described herein, may be executed on one or more computer systems, which may interact with various other devices. One such computer system is computer system 1300 illustrated by FIG. 13, which may in various embodiments implement any of the elements or functionality illustrated in FIGS. 1-12. In various embodiments, computer system 1300 may be configured to implement methods described above. The computer system 1300 may be used to implement any other system, device, element, functionality or method of the above-described embodiments. In the illustrated embodiments, computer system 1300 may be configured to implement methods 200, 300, 400, 500, 600, and 700 as processor-executable executable program instructions 1322 (e.g., program instructions executable by processor(s) 1310) in various embodiments.

In the illustrated embodiment, computer system 1300 includes one or more processors 1310 coupled to a system memory 1320 via an input/output (I/O) interface 1330. Computer system 1300 further includes a network interface 1340 coupled to I/O interface 1330, and one or more input/output devices 1350, such as cursor control device 1360, keyboard 1370, and display(s) 1380. In various embodiments, any of components may be utilized by the system to receive user input described above. In various embodiments, a user interface may be generated and displayed on display 1380. In some cases, it is contemplated that embodiments may be implemented using a single instance of computer system 1300, while in other embodiments multiple such systems, or multiple nodes making up computer system 1300, may be configured to host different portions or instances of various embodiments. For example, in one embodiment some elements may be implemented via one or more nodes of computer system 1300 that are distinct from those nodes implementing other elements. In another example, multiple nodes may implement computer system 1300 in a distributed manner.

In different embodiments, computer system 1300 may be any of various types of devices, including, but not limited to, a personal computer system, desktop computer, laptop, notebook, or netbook computer, mainframe computer system, handheld computer, workstation, network computer, a camera, a set top box, a mobile device, a consumer device, video game console, handheld video game device, application server, storage device, a peripheral device such as a switch, modem, router, or in general any type of computing or electronic device.

In various embodiments, computer system 1300 may be a uniprocessor system including one processor 1310, or a multiprocessor system including several processors 1310 (e.g., two, four, eight, or another suitable number). Processors 1310 may be any suitable processor capable of executing instructions. For example, in various embodiments processors 1310 may be general-purpose or embedded processors implementing any of a variety of instruction set architectures (ISAs), such as the x96, PowerPC, SPARC, or MIPS ISAs, or any other suitable ISA. In multiprocessor systems, each of processors 1310 may commonly, but not necessarily, implement the same ISA.

System memory 1320 may be configured to store program instructions 1322 and/or data 1332 accessible by processor 1310. In various embodiments, system memory 1320 may be implemented using any suitable memory technology, such as static random access memory (SRAM), synchronous dynamic RAM (SDRAM), nonvolatile/Flash-type memory, or any other type of memory. In the illustrated embodiment, program instructions and data implementing any of the elements of the embodiments described above may be stored within system memory 1320. In other embodiments, program instructions and/or data may be received, sent or stored upon different types of computer-accessible media or on similar media separate from system memory 1320 or computer system 1300.

In one embodiment, I/O interface 1330 may be configured to coordinate I/O traffic between processor 1310, system memory 1320, and any peripheral devices in the device, including network interface 1340 or other peripheral interfaces, such as input/output devices 1350. In some embodiments, I/O interface 1330 may perform any necessary protocol, timing or other data transformations to convert data signals from one components (e.g., system memory 1320) into a format suitable for use by another component (e.g., processor 1310). In some embodiments, I/O interface 1330 may include support for devices attached through various types of peripheral buses, such as a variant of the Peripheral Component Interconnect (PCI) bus standard or the Universal Serial Bus (USB) standard, for example. In some embodiments, the function of I/O interface 1330 may be split into two or more separate components, such as a north bridge and a south bridge, for example. Also, in some embodiments some or all of the functionality of I/O interface 1330, such as an interface to system memory 1320, may be incorporated directly into processor 1310.

Network interface 1340 may be configured to allow data to be exchanged between computer system 1300 and other devices attached to a network (e.g., network 1390), such as one or more external systems or between nodes of computer system 1300. In various embodiments, network 1390 may include one or more networks including but not limited to Local Area Networks (LANs) (e.g., an Ethernet or corporate network), Wide Area Networks (WANs) (e.g., the Internet), wireless data networks, some other electronic data network, or some combination thereof. In various embodiments, network interface 1340 may support communication via wired or wireless general data networks, such as any suitable type of Ethernet network, for example; via telecommunications/telephony networks such as analog voice networks or digital fiber communications networks; via storage area networks such as Fibre Channel SANs, or via any other suitable type of network and/or protocol.

Input/output devices 1350 may, in some embodiments, include one or more display terminals, keyboards, keypads, touch pads, scanning devices, voice or optical recognition devices, or any other devices suitable for entering or accessing data by one or more computer systems 1300. Multiple input/output devices 1350 may be present in computer system 1300 or may be distributed on various nodes of computer system 1300. In some embodiments, similar input/output devices may be separate from computer system 1300 and may interact with one or more nodes of computer system 1300 through a wired or wireless connection, such as over network interface 1340.

In some embodiments, the illustrated computer system may implement any of the methods described above, such as the methods illustrated by the flowchart of FIGS. 2-7, as well as to implement the displays shown in FIGS. 8-12. In other embodiments, different elements and data may be included.

Those skilled in the art will appreciate that computer system 1300 is merely illustrative and is not intended to limit the scope of embodiments. In particular, the computer system and devices may include any combination of hardware or software that can perform the indicated functions of various embodiments, including computers, network devices, Internet appliances, PDAs, wireless phones, pagers, etc. Computer system 1300 may also be connected to other devices that are not illustrated, or instead may operate as a stand-alone system. In addition, the functionality provided by the illustrated components may in some embodiments be combined in fewer components or distributed in additional components. Similarly, in some embodiments, the functionality of some of the illustrated components may not be provided and/or other additional functionality may be available.

Those skilled in the art will also appreciate that, while various items are illustrated as being stored in memory or on storage while being used, these items or portions of them may be transferred between memory and other storage devices for purposes of memory management and data integrity. Alternatively, in other embodiments some or all of the software components may execute in memory on another device and communicate with the illustrated computer system via inter-computer communication. Some or all of the system components or data structures may also be stored (e.g., as instructions or structured data) on a computer-accessible medium or a portable article to be read by an appropriate drive, various examples of which are described above. In some embodiments, instructions stored on a computer-accessible medium separate from computer system 600 may be transmitted to computer system 1300 via transmission media or signals such as electrical, electromagnetic, or digital signals, conveyed via a communication medium such as a network and/or a wireless link. Various embodiments may further include receiving, sending or storing instructions and/or data implemented in accordance with the foregoing description upon a computer-accessible medium or via a communication medium. In general, a computer-accessible medium may include a storage medium or memory medium such as magnetic or optical media, e.g., disk or DVD/CD-ROM, volatile or non-volatile media such as RAM (e.g., SDRAM, DDR, RDRAM, SRAM, etc.), ROM, etc.

The methods described herein may be implemented in software, hardware, or a combination thereof, in different embodiments. In addition, the order of methods may be changed, and various elements may be added, reordered, combined, omitted, modified, etc. All examples described herein are presented in a non-limiting manner. Various modifications and changes may be made as would be obvious to a person skilled in the art having benefit of this disclosure. Realizations in accordance with embodiments have been described in the context of particular embodiments. These embodiments are meant to be illustrative and not limiting. Many variations, modifications, additions, and improvements are possible. Accordingly, plural instances may be provided for components described herein as a single instance. Boundaries between various components, operations and data stores are somewhat arbitrary, and particular operations are illustrated in the context of specific illustrative configurations. Other allocations of functionality are envisioned and may fall within the scope of claims that follow. Finally, structures and functionality presented as discrete components in the example configurations may be implemented as a combined structure or component. These and other variations, modifications, additions, and improvements may fall within the scope of embodiments as defined in the claims that follow.

While the foregoing is directed to embodiments of the present invention, other and further embodiments of the invention may be devised without departing from the basic scope thereof, and the scope thereof is determined by the claims that follow.

The invention claimed is:

1. A computer-implemented method for predicting online social community reaction comprising:
receiving a proposed post prior to the proposed post being posted to an online social community;
generating, by at least one processor, a predicted community reaction to the proposed post;
providing the predicted community reaction prior to the proposed post being posted to the online social community by displaying a plurality of words of the proposed post that contribute to the predicted community reaction, wherein a color of one or more words from the plurality of words reflects a performance indicator and wherein a font size of the one or more words indicates extremity of a predicted online social community reaction corresponding to the one or more words, and wherein the predicted community reaction comprises a predicted sentiment score and at least one of a predicted number of responses, a predicted number of responders to the proposed post, a predicted longevity of the proposed post, or a predicted half-life of the proposed post;
suggesting, by the at least one processor, one or more revisions to the proposed post; and
posting the proposed post, with the suggested one or more revisions, to the online social community.

2. The method of claim 1, wherein generating the predicted community reaction comprises:
gathering, by the at least one processor, a plurality of posts from one or more online social communities and at least one response to each post of the plurality of posts;
calculating, by the at least one processor, a plurality of performance indicators for each post in the plurality of posts, wherein the plurality of performance indicators comprise a sentiment score for the at least one response and at least one of a number of responses to the post, a number of responders to the post, a longevity of the post, or a half-life of the post;
de-biasing the calculated plurality of performance indicators; and
building, by the at least one processor, a prediction model using the de-biased plurality of performance indicators.

3. The method of claim 1, further comprising:
identifying new terms based on the proposed post and the predicted community reaction;
predicting a new sentiment score for each of the new terms; and
suggesting the one or more revisions to the proposed post based on the predicted sentiment score and the new sentiment score for each of the new terms, wherein the suggested one or more revisions comprises at least one new term from the new terms.

4. The method of claim 2, wherein de-biasing comprises calculating a mean (m) and a standard deviation (s) of the plurality of performance indicators for a given post from the plurality of posts and calculating a normalized score (r) to determine a de-biased score r', where $r'=(r-m)/s$.

5. The method of claim 2, wherein building the prediction model comprises:
accessing the plurality of posts and a score for each post in the plurality of posts;
retrieving a plurality of terms from each post in the plurality of posts;
calculating a conditional probability for each term in the plurality of terms;
determining one or more terms with a conditional probability that maximize entropy; and
adding the determined one or more terms to the prediction model.

6. The method of claim 1, wherein providing the predicted community reaction further comprises:
displaying a plurality of bins corresponding to at least a portion of the predicted community reaction, wherein a color of one or more bins indicates confidence in the at least a portion of the predicted community reaction corresponding to the one or more bins.

7. The method of claim 1, wherein generating the predicted community reaction comprises:
identifying a plurality of terms and bigrams from the proposed post; determining a class for which a prediction is to be made for one or more terms and bigrams in the plurality of identified terms and bigrams; and
determining a probability that the one or more terms and bigrams in the plurality of identified terms and bigrams will be in the class.

8. The method of claim 4, wherein predicting the new sentiment score for each of the new terms further comprises:
identifying at least one term from the proposed post with a negative predicted sentiment score; and
predicting sentiment scores for synonyms of the at least one term with the negative predicted sentiment score.

9. A system for predicting an online social community reaction prior to sharing a post comprising:
at least one processor; and
at least one non-transitory computer readable storage medium storing instructions thereon that, when executed by the at least one processor, cause the system to:
receive a proposed post as input to a prediction model prior to the proposed post being posted to an online social community;
generate, by the at least one processor, a predicted community reaction to the proposed post using the prediction model;
provide the predicted community reaction prior to the proposed post being posted to the online social community by displaying a plurality of words of the proposed post that contribute to the predicted community reaction, wherein a color of one or more words from the plurality of words reflects a performance indicator and wherein a font size of the one or more words indicates extremity of a predicted online social community reaction corresponding to the one or more words, and wherein the predicted community reaction comprises a predicted sentiment score and at least one of a predicted number of responses, a predicted number of responders to the proposed post, a predicted longevity of the proposed post, or a predicted half-life of the proposed post;

post the proposed post, with the suggested one or more revisions, to the online social community.

10. The system of claim 9, further comprising instructions thereon, that when executed by the at least one processor, cause the system to:

gather, by the at least one processor, a plurality of posts from one or more online social communities and at least one response to each post of the plurality of posts;

calculate, by the at least one processor, a plurality of performance indicator for the at least one response, wherein the plurality of performance indicators comprise a sentiment score for the at least one response and at least one of a number of responses to the post, a number of responders to the post, a longevity of the post, a sentiment score for the at least one response or a half-life of the post;

de-bias the calculated plurality of performance indicators; and build the prediction model using the de-biased plurality of performance indicators.

11. The system of claim 9, wherein providing the predicted community reaction comprises:

displaying a plurality of bins corresponding to at least a portion of the predicted community reaction, wherein a color of one or more bins indicates confidence in the at least a portion of the predicted community reaction corresponding to the one or more bins.

12. The system of claim 10, wherein de-biasing comprises calculating a mean (m) and a standard deviation (s) of the plurality of performance indicators for responses to a given post and calculating a normalized score (r) to determine a de-biased score r', where $r'=(r-m)/s$.

13. The system of claim 10, wherein building the prediction model comprises:

accessing the plurality of posts and a score for each post in the plurality of posts;

retrieving a plurality of terms from each post in the plurality of posts;

calculating a conditional probability for each term in the plurality of terms;

determining one or more terms with a conditional probability that maximize entropy; and adding the determined one or more terms to the prediction model.

14. The system of claim 9, wherein generating a predicted community reaction comprises:

identifying a plurality of terms and bigrams from the proposed post;

determining a class for which a prediction is to be made for one or more terms and bigrams in the plurality of identified terms and bigrams; and determining a probability that the one or more terms and bigrams in the plurality of identified terms and bigrams will be in the class.

15. The system of claim 9, further comprising instructions, that when executed by the at least one processor, cause the system to:

identify new terms based on the proposed post and the predicted community reaction;

predict a new sentiment score for each of the new terms: and suggest one or more revisions to the proposed post based on the predicted sentiment score and the new sentiment score for each of the new terms, wherein the suggested one or more revisions comprises at least one new term from the new terms.

16. A method for predicting community reaction to a post comprising:

receiving a proposed post as input to a prediction model prior to the proposed post being posted to an online social community;

generating, by at least one processor, a predicted community reaction to the proposed post using the prediction model;

providing the predicted community reaction prior to the proposed post being posted to the online social community, wherein the predicted community reaction comprises a predicted sentiment score and at least one of a predicted number of responses, a predicted number of responders to the proposed post, a predicted longevity of the proposed post, or a predicted half-life of the proposed post by:

displaying a plurality of bins corresponding to at least a portion of the predicted community reaction, wherein each of the plurality of bins reflects an interval of at least one of sentiment scores, number of responses, number of responders, longevity, or half-life, and wherein a color of one or more bins indicates confidence in the at least a portion of the predicted community reaction corresponding to the one or more bins; and displaying a plurality of words of the proposed post that contribute to the predicted community reaction, wherein a color of one or more words from the plurality of words reflects a performance indicator and wherein a font size of the one or more words indicates extremity of a predicted online social community reaction corresponding to the one or more words;

suggesting, by the at least one processor, one or more revisions to the proposed post; and posting the proposed post, with the suggested one or more revisions, to the online social community.

17. The method of claim 16, wherein generating the prediction model comprises:

gathering a plurality of posts from one or more online social communities and at least one response to each post of the plurality of posts;

calculating a plurality of performance indicators for each post in the plurality of posts, wherein the plurality of performance indicators comprise a sentiment score for the at least one response and at least one of a number of responses to the post, a number of responders to the post, a longevity of the post, or a half-life of the post;

de-biasing the calculated plurality of performance indicators; and building the prediction model using the de-biased plurality of performance indicators.

18. The method of claim 16, wherein suggesting, by the at least one processor, one or more revisions to the proposed post further comprises:

identifying one or more new terms based on the proposed post and the predicted community reaction;

predicting, by the at least one processor using the prediction model, a new sentiment score for each of the one or more new terms; and suggesting, by the at least one processor, one or more revisions to the proposed post in light of the predicted sentiment score and the new sentiment score for each of the one or more new terms.

19. The method of claim 17, further comprising retraining the prediction model at predefined intervals of time.

20. The method of claim 17, wherein de-biasing comprises calculating a mean (m) and a standard deviation (s) of the performance indicators for responses to a given post and calculating a normalized score (r) to determine a de-biased score r', where r'=(r−m)/s.

* * * * *